(12) United States Patent
Kuroda et al.

(10) Patent No.: US 11,349,311 B2
(45) Date of Patent: May 31, 2022

(54) VOLTAGE STABILITY MONITORING DEVICE AND METHOD

(71) Applicant: Hitachi, Ltd., Tokyo (JP)

(72) Inventors: Eisuke Kuroda, Tokyo (JP); Masahiro Watanabe, Tokyo (JP); Masahiro Yatsu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1022 days.

(21) Appl. No.: 16/062,477

(22) PCT Filed: Nov. 9, 2016

(86) PCT No.: PCT/JP2016/083149
§ 371 (c)(1),
(2) Date: Jun. 14, 2018

(87) PCT Pub. No.: WO2017/104302
PCT Pub. Date: Jun. 22, 2017

(65) Prior Publication Data
US 2018/0375329 A1 Dec. 27, 2018

(30) Foreign Application Priority Data
Dec. 16, 2015 (JP) .............................. JP2015-244947

(51) Int. Cl.
*H02J 3/24* (2006.01)
*H02J 3/00* (2006.01)
(Continued)

(52) U.S. Cl.
CPC ............ *H02J 3/24* (2013.01); *G01R 19/2506* (2013.01); *G01R 19/2513* (2013.01); *H02J 3/00* (2013.01);
(Continued)

(58) Field of Classification Search
CPC ...... H02J 3/24; H02J 3/00; H02J 13/00; H02J 3/003; H02J 2203/20; H02J 3/242;
(Continued)

(56) References Cited

U.S. PATENT DOCUMENTS 5,745,368 A * 4/1998 Ejebe ..................... H02J 3/00
307/102
2003/0139887 A1 * 7/2003 Fulczyk .................. H02J 3/24
702/60
(Continued)

FOREIGN PATENT DOCUMENTS

EP 3 163 706 A1 5/2017
JP 6-113465 A 4/1994
(Continued)

OTHER PUBLICATIONS

Extended European Search Report issued in counterpart European Application No. 16 875 286.3 dated Jan. 2, 2020 (four (4) pages).
(Continued)

*Primary Examiner* — Ziaul Karim
(74) *Attorney, Agent, or Firm* — Crowell & Moring LLP

(57) ABSTRACT

A voltage stability monitoring device and a method capable of obtaining information of voltage stability that can be served to practical use within a range of assumed conditions during a predetermined monitoring period are provided. The present invention provides a voltage stability monitoring device for estimating a voltage stability by using a voltage stability curve representing the voltage stability in an electric power system, including a voltage stability limit prediction unit for predicting a voltage stability limit, a voltage stability calculation condition determination unit for determining voltage stability calculation conditions by using a prediction result of voltage stability limit, a voltage stability curve calculation unit for calculating the voltage stability curve using a result of the voltage stability calculation
(Continued)

condition determination, and a voltage stability margin calculation unit for calculating a voltage stability margin using a calculation result of the voltage stability curve.

21 Claims, 20 Drawing Sheets

(51) Int. Cl.
*H02J 13/00* (2006.01)
*G01R 19/25* (2006.01)

(52) U.S. Cl.
CPC ............... *H02J 13/00* (2013.01); *H02J 3/003* (2020.01); *H02J 2203/20* (2020.01)

(58) Field of Classification Search
CPC ............... H02J 3/241; H02J 13/00002; G01R 19/2506; G01R 19/2513; Y02E 40/70; Y02E 60/00; Y04S 10/22; Y04S 10/30; Y04S 40/20
See application file for complete search history.

(56) References Cited

U.S. PATENT DOCUMENTS

| | | | | |
|---|---|---|---|---|
| 2003/0144802 A1* | 7/2003 | Fulczyk | ..................... | H02J 3/24 702/57 |
| 2006/0111860 A1* | 5/2006 | Trias | ..................... | G01R 21/00 702/85 |
| 2009/0027067 A1* | 1/2009 | Li | ..................... | G01R 27/16 702/65 |
| 2012/0274268 A1* | 11/2012 | Ishida | ..................... | H02J 7/007 320/107 |
| 2013/0066480 A1* | 3/2013 | Glavic | ..................... | H02J 3/14 700/286 |
| 2014/0032138 A1* | 1/2014 | Shrestha | ............... | G01R 31/343 702/58 |
| 2015/0214741 A1* | 7/2015 | Kuroda | ..................... | H02J 3/30 700/298 |
| 2017/0045558 A1 | 2/2017 | Kuroda et al. | | |

FOREIGN PATENT DOCUMENTS

| | | |
|---|---|---|
| JP | 6-153397 A | 5/1994 |
| JP | 8-130828 A | 5/1996 |
| JP | 2001-25168 A | 1/2001 |
| JP | 2005-12930 A | 1/2005 |
| JP | 2015-211512 A | 11/2015 |
| WO | WO 2015/163121 A1 | 10/2015 |

OTHER PUBLICATIONS

Japanese-language Office Action issued in counterpart Japanese Application No. 2015-244947 dated Apr. 23, 2019 with unverified English translation (nine pages).
Holten et al., "Comparison of Different Methods for State Estimation," IEEE Transactions on Power Systems, vol. 3, No. 4, pp. 1798-1806, Nov. 1988.
William F Tinney et al., "Power Flow Solution by Newton's Method," IEEE Transactions on Power Apparatus and Systems, vol. PAS-86, No. 11, pp. 1449-1460, Nov. 1967.
Chiang. H. D. et al., "Look-ahead Voltage and Load Margin Contingency Selection Functions for Large-Scale Power Systems and Systems," IEEE Trans. on Power Systems, vol. 12, No. 1, pp. 173-180, Feb. 1997.
Chiang. H. D. et al., "CPFLOW: A Practical Tool for Tracing Power System Steady-State Stationary Behavior Due to Load and Generation Variations," IEEE Trans. on Power Systems, vol. 10, No. 2, pp. 623-634, May 1995.
Venkataramana Ajjarapu, "Computational Techniques for Voltage Stability Assessment and Control", Springer, pp. 49-116, 2006.
Bonini Neto A. et al., "Technique for Continuation Power Flow Using the "Flat Start" and for Ill-Conditioned Systems," World Journal Control Science and Engineering, vol. 3, No. 1, pp. 1-7, Jan. 2015.
Yorino, "Trend in Voltage Stability Problem and its Analysis Technique", Electrical Engineers of Japan B, vol. 123, No. 7, pp. 803-807, 2003.
Mori, et al., "Continuation Power Flow with the Nonlinear Predictor of the Lagrange's Polynomial Interpolation Formula," IEEE of Japan B, vol. 123, No. 4, pp. 539-549, 2003.
Fukuyama et. al., "Continuation Power Flow, Development of a Practical Continuation Power Flow System," Institute of Electrical Engineers of Japan, No. 1387, 1997.
Neto et al., "Development and Assessment of Nonlinear Predictors for Continuation Method," International Journal of Engineering and Applied Sciences, vol. 5, No. 01, pp. 1-9, Jun. 2014.
E. E .Nino et al., "Continuation Load Flow Using Automatically Determined Branch Megawatt Losses as Parameters," IEE Proc.-Gener. Transm. Distrib., vol. 153, No. 3, pp. 300-308, May 2006.
Akihiko et al., "Static Voltage Stability Index Utilizing the Power Flow Multiple Solution," T. IEE of Japan (Electric Power & Energy Section Journal), vol. 110-B, No. 11, pp. 870-879, 1990.
Mori et al., "CPFLOW with the Householder Transfer Method," P-01-128, PSE-01-122, pp. 1-6, 2001.
Yorino et al., "A Continuation Power Flow Tracing Q-Limit Points on Dicurcation Diagrams in Power Systems," Institute of Electrical Engineers of Japan B, vol. 119, No. 2, pp. 259-267, 1999.
Kataoka et al., "Voltage Stability Limit in Electric Power System with Reactive Power Constraints on Generators," Institute of Electrical Engineers of Japan B, vol. 123, No. 6, pp. 704-717, 2003.
Extended European Search Report issued in counterpart European Application No. 16875286.3 dated Mar. 29, 2019 (10 pages).
International Search Report (PCT/ISA/210) issued in PCT Application No. PCT/JP2016/083149 dated Jan. 24, 2017 with English translation (two (2) pages).
Japanese-language Written Opinion (PCT/ISA/237) issued in PCT Application No. PCT/JP2016/083149 dated Jan. 24, 2017 (four (4) pages).
Suzuki et al., "Voltage Stability on Line Monitoring System", Electrical Engineers of Japan B, vol. 111, No. 3, 1991 with partial unverified English translation (ten (10) pages).

\* cited by examiner

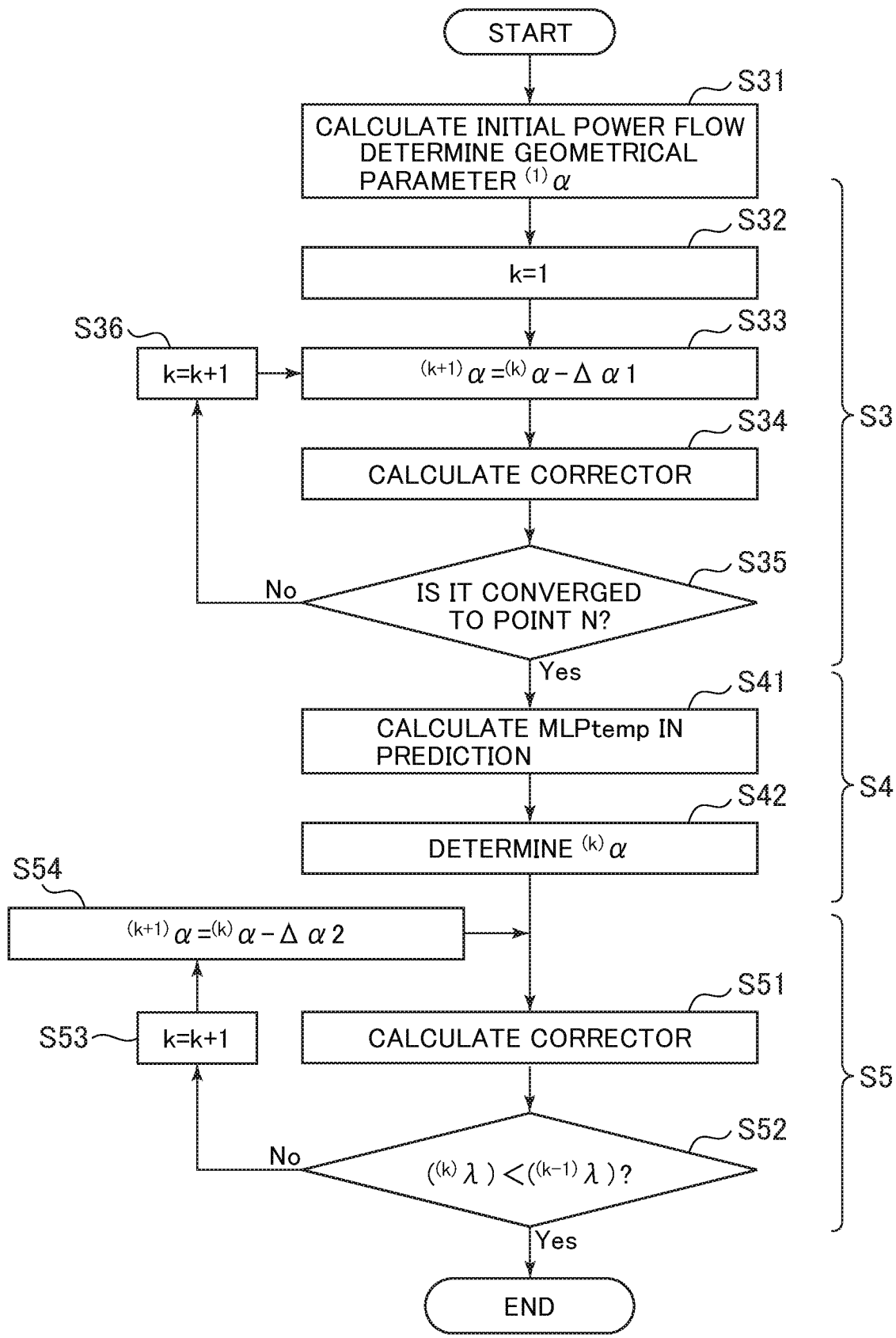

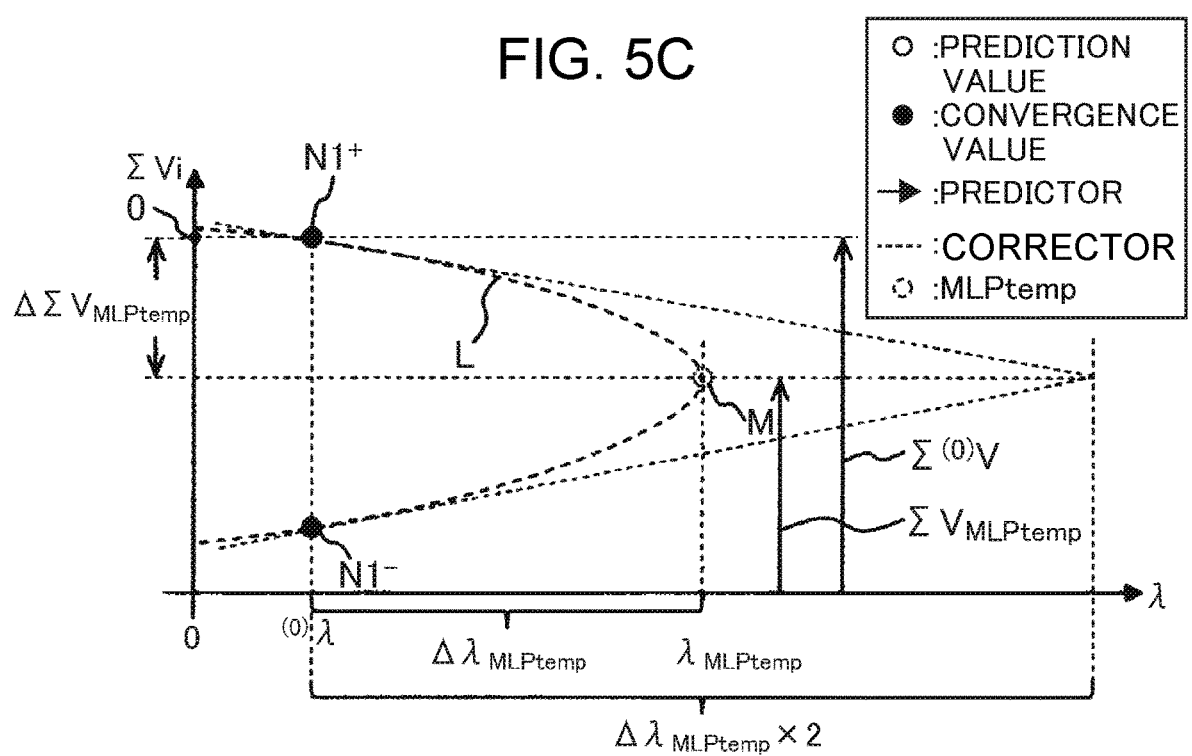
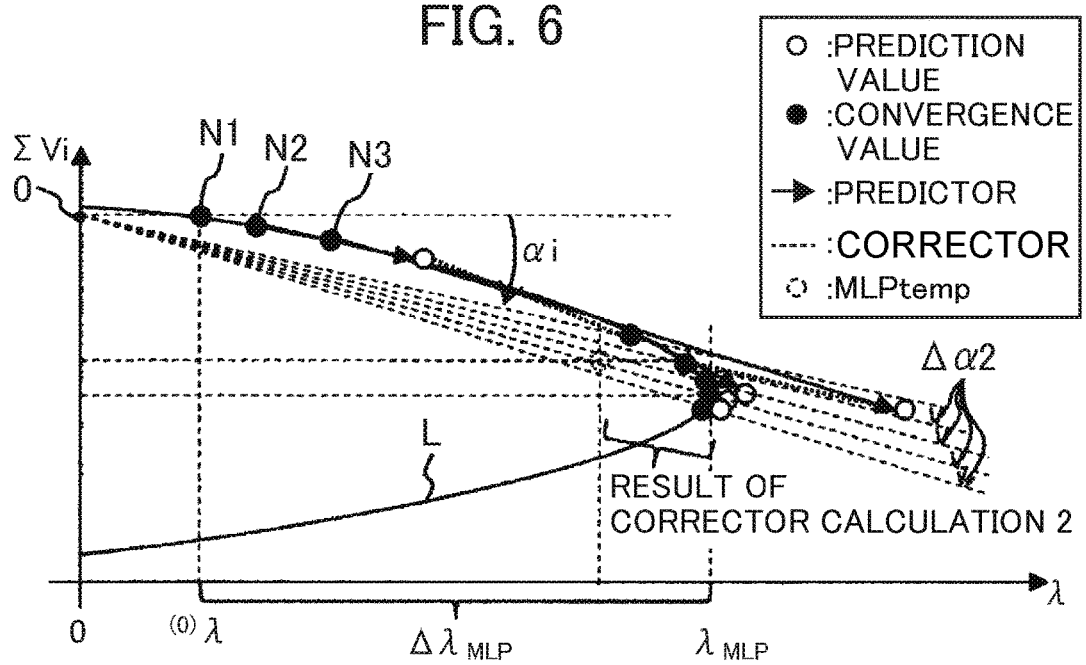

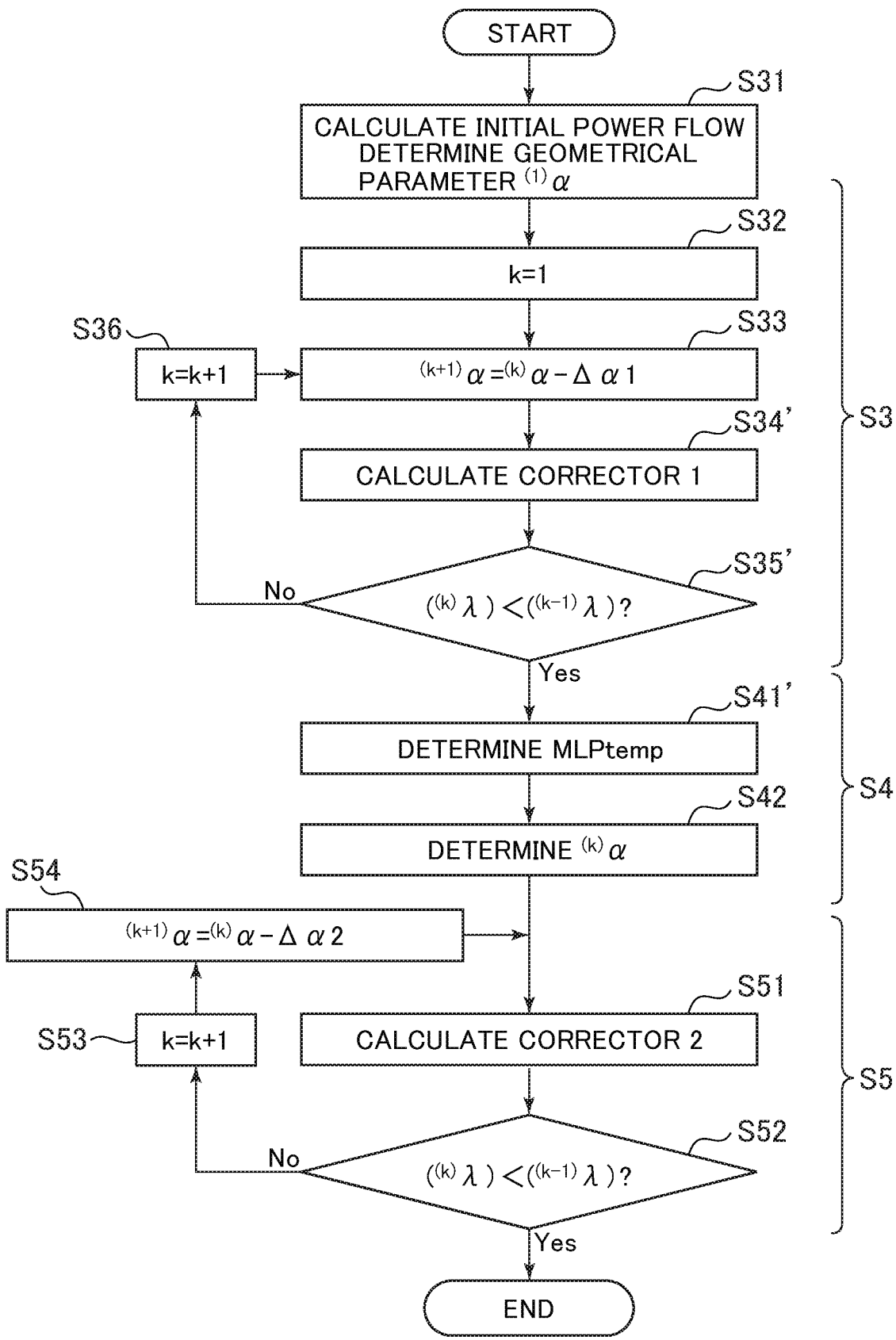

VOLTAGE STABILITY MONITORING DEVICE AND METHOD

TECHNICAL FIELD

The present invention relates to a voltage stability monitoring device and a method for monitoring a voltage stability or voltage stabilization of a power system. In the present invention, the voltage stability and the voltage stabilization are collectively referred to as voltage stability when it is not necessary to distinguish them

BACKGROUND ART

The background art of this technical field for monitoring the voltage stability of a power system includes "voltage stability online monitoring system" by Mamoru Suzuki, Yukio Kishida: Electrical Engineers of Japan B, 111(3), 1991 (Non-Patent Literature 1). Review articles of Non-Patent Literature 1 describe "periodical online monitoring function" and "stability judgement function on peak load" (refer to pp 248 to 251 of the text).

Further, the background art of this technical field for monitoring the voltage stability in the electric power system includes Japanese Unexamined Patent Application Publication H08-130828 (Patent Literature 1). Patent Literature 1 describes that a power flow calculation is executed based on reference bus on at least two points relative to a target load bus intended to obtain a voltage stability state in the electric power system, to judge the voltage stability state based on the difference information of each of P-V curves".

Further, the background art of this technical field for monitoring the voltage stability in the electric power system includes Japanese Unexamined Patent Application Publication 2001-025168 (Patent Literature 2). The Patent Literature 2 describes that "This relates to a voltage reliability analysis method of evaluating voltage reliability of a system for given system configuration, impedance of each of equipment, each of load capacitances, each of power sources and capacity thereof, a designated voltage value, amount of load fluctuation, etc. in the system, a load margin value at a voltage stability limit point after an assumed accident is determined, for all distribution lines or all generators by an approximate calculation method based on a continuation power flow calculation and a voltage reliability of the system an accidental sorted case using the load margin value as an index of the voltage stability is evaluated by the continuation power flow calculation. Respective accident cases are distributed over plural operation devices and the voltage stability is calculated in parallel by respective operation devices, thereby sorting an accident case in accordance with the voltage stability while aggregating the voltage stability of all determined accident cases in one operation device in accordance with the voltage stability.

CITATION LIST

Patent Literature

Patent Literature 1: Japanese Unexamined Patent Application Publication H08-130828
Patent Literature 2: Japanese Unexamined Patent Application Publication 2001-025168

Non-Patent Literature

Non-Patent Literature 1: Mamoru Suzuki, Yukio Kishida; "Voltage stability on line monitoring system", Electrical Engineers of Japan B, vol. 111, No. 3, Hei 03

SUMMARY OF INVENTION

Technical Problem

According to the existent voltage stability monitoring device described in Non-Patent Literature 1, a possibility of the voltage stability worsening can be monitored by assuming one or both of assumption of power flow fluctuation, and accidents or failures.

However, a great amount of power sources of fluctuating outputs depending on weather including regeneratable energy (solar light power generation, wind power generation, etc.) are to be introduced in the future to the electric power system. However, in the configuration of the electric power system, since the rechargeable energy may possibly fluctuate in the output depending on the weather, the voltage or the amount of power flow may fluctuate greatly. Further, in accordance with introduction of the regeneratable energy, restrictions of voltage characteristics of load and the generator output and line power flow may be fluctuated possibly. Further, there may be also a possibility of fluctuation in the system configuration caused by fluctuation in view of system configuration, and fluctuation in the system configuration caused by accidents or failures, for example, due to lightening thunder to the system.

Accordingly, in a case of calculating and monitoring the voltage stability by the existent voltage stability control device described in Non-Patent Literature 1, there is a problem of possibly increasing the calculation amount or causing unconvergence or non-convergence unless appropriate calculation conditions are used.

Further, there may be sometimes necessary to assume each of the fluctuations described above and calculate and monitor the voltage stability for each of them. However, it may be a possibility of increasing the calculation amount and causing unconvergence or non-convergence unless appropriate calculation conditions are used corresponding to each of the fluctuations. Accordingly, there is a problem that the calculation is not completed depending on the monitoring period or the calculation is insufficient and there is a possibility that severe fluctuation condition and voltage stability margin thereof cannot be calculated.

Further, conditions of increasing load or power flow assumed in the voltage stability calculation include various cases such as a case where entire target loads are increased uniformly, or a case where the power flow increases in a particular power distribution route including one or more power distribution lines. Further, there is also a case where target buses or locations to be monitored for the voltage stability margin to the increasing conditions of the load or the power flow are present by one or more.

Accordingly, depending on the monitoring period there is a problem that the calculation for the voltage stability margin to all the cases is not completed, or buses or the locations as the monitoring targets or calculation is insufficient and severe fluctuation conditions, the cases or the buses or locations as monitoring target, and voltage stability margin thereof cannot possibly be calculated.

On the other hand, in a case where the voltage stability is calculated and monitored under the condition not considering the characteristics or restrictions described above, while the increase in the calculation amount and unconvergence or non-convergence are less caused, since the accuracy for the voltage stability margin is worsened by so much, it is necessary to monitor the voltage stability by adding a margin to the voltage stability margin.

Accordingly, in a case of preventive control (previous control) or subsequent control with respect to the voltage stability, since the control amount may possibly be increased due to the margin, it may possibly deteriorate the economicalness. Further, when the power distribution capacity may possibly be decreased by the margin, this may lead to a possibility of suppressing the economical output of the generator. Further, in the worst case, the voltage stability margin lacks to cause a possibility of voltage instability. Accordingly, there may be a problem of causing each of the possibilities described above.

In relation to the problem described above, for the voltage stability monitoring method and the device of an electric power system described in Patent Literature 1 it is described that "a power flow calculation based on a reference bus on at least two locations is executed to the target load bus intended to obtain a voltage stable state in the electric power system, and the voltage stability state is judged based on the difference information in each of P-V curves". However, even when "the power flow calculation is executed based on the reference bus on at least two locations, and the voltage stability state is judged based on the difference information for each of the PV curves", each of the problems described above cannot be solved.

In the same manner, in relation to the problem described above, in the parallel processing method in voltage reliability analysis in the electric power system described in the Patent Literature 2, it is described that this relates to a voltage reliability analysis method and, "when system configuration, impedance of each of equipment, each load capacity, each power sources and capacity thereof, indicated voltage value, load fluctuation amount, etc. in the system are given, the load margin value at a voltage stability limit point after the assumed accident is determined by an approximate calculation method based on the continuation power flow calculation for the accident case sorted as the index of the voltage stability. Respective accident cases are distributed over plural operation devices and the voltage stability is calculated in parallel and voltage stability of all determined accident cases are aggregated in one operation device and the accident case is sorted". However, even if "the load margin value at the voltage stability limit point after the assumed accident is determined by the approximate method based on the continuation power flow calculation and the voltage reliability of the system is evaluated by the continuation power flow calculation to the target accident case sorted as the index of the load margin value being sorted as the index of the voltage stability", there is still a problem that a possibility of increasing the calculation amount or causing the unconvergence or non-convergence taking each of other fluctuation into consideration unless the appropriate calculation conditions are used.

In view of the above, the present invention intends to provide a voltage stability monitoring device and a method capable of obtaining information of a voltage stability that can be served to practical use in a range of assumed conditions and within a predetermined monitoring period.

Referring more specifically, on the assumption in the embodiments of the present invention, it is assumed generation or not generation of one or more of fluctuations in the voltage or fluctuation conductions of the frequency characteristics and voltage characteristics, parallel-in and parallel-out conditions of phase modifying equipment, load power factor fluctuation conditions, fluctuation conditions of generator output, reactive power supply equipment or line power flow restriction, change or fluctuation conditions of the system configuration in view of the system operation, fluctuation conditions of the line impedance that fluctuates by the line temperature, wind velocity and the power flow amount, fluctuation conditions of the system configuration caused by accident or failures, for example, due to lightening thunder to the system, or one or more buses or location as monitoring targets for the voltage stability margin, it is intended to provide a technique capable of calculating and monitoring one or more of severe fluctuation conditions, the cases and the buses and locations as monitoring target, a technique capable of calculating and monitoring, the voltage stability and the voltage stability margin thereof, a technique capable of reducing increase in the calculation amount, the unconvergence or non-convergence in the calculation, a technique capable of reducing the margin, a technique not deteriorating the economicalness, a technique not reducing the distribution capacity, a technique not suppressing the economical output of the generator, and a technique of not causing the voltage instability, as well as a device.

Solution to Problem

For solving the problems described above, the present invention uses the configuration, for example, described in the scope of claim for patent in order to solve the problem described above. The present invention includes a plurality of means for solving the problems and an example thereof includes; a voltage stability monitoring device for estimating a voltage stability by using a voltage stability curve representing the voltage stability in an electrical power system, including: a voltage stability limit prediction unit for predicting a voltage stability limit in the voltage stability curve, a voltage stability calculation condition determination unit for determining voltage stability calculation conditions by using a prediction result of the voltage stability, a voltage stability curve calculation unit for calculating the voltage stability curve by using the voltage stability calculation conditions, and a voltage stability margin calculation unit for calculating a voltage stability margin by using a calculation result of the voltage stability curve.

Further, the present invention provides "a voltage stability monitoring device for estimating a voltage stability by using a voltage stability curve representing the voltage stability in an electrical power system, including: a first processing unit for determining an initial convergence point on a coordinate representing the voltage stability curve by initial power flow calculation, a second processing unit for determining a geometrical parameter value of a straight line or a curve passing a reference point determined on the coordinate, or a geometrical parameter value of a circle or a sphere having, as a center, the reference point or each of convergence points, a third processing unit for determining a plurality of convergence points on the voltage stability curve by using the geometrical parameter values, a fourth processing unit for determining the voltage stability curve in view of the plurality of convergence points, and a fifth processing unit for determining a margin value of the voltage stability based on the value according to the voltage or the electrical power at the maximum load point of the voltage stability curve and a value relating to the voltage or electric power at the reference point determining the initial convergence point or determined reference point.

Further, the present invention provides a voltage stability monitoring method of estimating a voltage stability by using a voltage stability curve representing a voltage stability in an electric power system, including; a voltage stability monitoring method of estimating voltage stability by using a voltage stability curve representing a voltage stability in an electric power system, including a first step of determining an initial convergence point on a coordinate representing a voltage stability curve by initial power flow calculation, a second step of determining a geometrical parameter value of a straight line or a curve passing a reference point determined on the coordinate, or a geometrical parameter value of a circle having, as a center, the reference point or each of convergence points, a third step of determining a plurality of convergence points on the voltage stability curve by using the geometrical parameter values, a fourth step of determining the voltage stability curve in view of the plurality of convergence points, and a fifth step of determining a voltage value based of the stability margin on the value according to the voltage or the electric power at the maximum load point on the voltage stability curve and the value according to the voltage or the electric power at the initial convergence point or the determined reference point.

Further, the present invention provides a voltage stability monitoring method for estimating a voltage stability by using a voltage stability curve representing a voltage stability in an electric power system, including; setting a geometrical parameter of a straight line or curves passing a determined reference point on a coordinate representing a voltage stability curve while changing successively, calculating convergence points on the voltage stability curve upon each of geometrical parameters, and defining the convergence point on the voltage stability curve upon geometrical parameter immediately before the convergence point as an intersection between the straight line or the curve and the voltage stability curve can no more be calculated or when the abscissa on the coordinate becomes maximum there before is defined as a maximum load point of the voltage stability curve.

Advantageous Effects of Invention

According to the present invention, it is possible to provide a voltage stability monitoring device and a method capable of obtaining information of a voltage stability that can be served to practical use in a range of assumed conditions and within a predetermined monitoring period.

Further, according to the embodiments of the present invention, assuming generation or not generation of one or more fluctuation of a voltage or a power flow amount caused, for example, by output fluctuation or load fluctuation in the regeneratable energy, change or fluctuation of a power source configuration, fluctuation of load frequency characteristics or voltage characteristics, parallel-in and parallel-out of phase modifying equipment, fluctuation of a load power factor, fluctuation of restriction of generator output, reactive power supplying equipment or line power flow, change or fluctuation of system configuration in view of a system operation, fluctuation of a line impedance that fluctuates due to a line temperature, a wind velocity and a power flow amount, and fluctuation of the system configuration due to accident or failure caused, for example, by lightening thunder to the system, etc. and, in a case where there are one or more fluctuation conditions of the voltage or the power flow amount caused by output fluctuation and load fluctuation of the regeneratable energy, changing conditions or fluctuation conditions of the power source configuration, fluctuation conditions of the load frequency characteristics and voltage characteristics, parallel in and out conditions of phase modifying equipment, fluctuation conditions of the load power factor, fluctuation conditions of restriction of the generator output, the reactive power supplying equipment, and the line power flow, changing conditions or fluctuation conditions of the system configuration in view of the system operation, fluctuation condition of the line impedance that fluctuates, for example, by the line temperature, the wind velocity, the power flow amount, etc. fluctuation conditions of the system, configuration caused by accident or failure, for example, due to the lightening thunder to the system, it is possible to calculate or monitor one or more severe conditions, the cases and buses or locations as monitoring targets, and one or more voltage stability and voltage stability margin thereof, and reduce the increase in the calculation amount within a constant or variable monitoring periods and reduce the unconvergence or non-convergence.

Further, according to the embodiments of the present invention, by utilizing the technique of reducing the increase in the calculation amount and the unconvergence or non-convergence, it is possible to reduce the margin and not to damage the economicalness, not to decrease the power distribution capacity, not to suppress the economic output of the generator and not to cause voltage instability.

BRIEF DESCRIPTION OF DRAWINGS

FIG. 4 is a flow chart showing processing from the voltage stability limit prediction to calculation of voltage stability curve.

FIG. 5C is a diagram of a $\lambda$-$\Sigma V_1$ curve for explaining the concept of determining the voltage stability.

FIG. 6 is a diagram showing an example of repeating processing step S51 to processing step S53.

FIG. 9 is a flow chart explaining another example of the processing of the voltage stability limit prediction calculation-voltage stability curve calculation.

DESCRIPTION OF EMBODIMENTS

Preferred embodiments of the present invention are to be described with reference to the drawings.

First Embodiment

Figure 2:
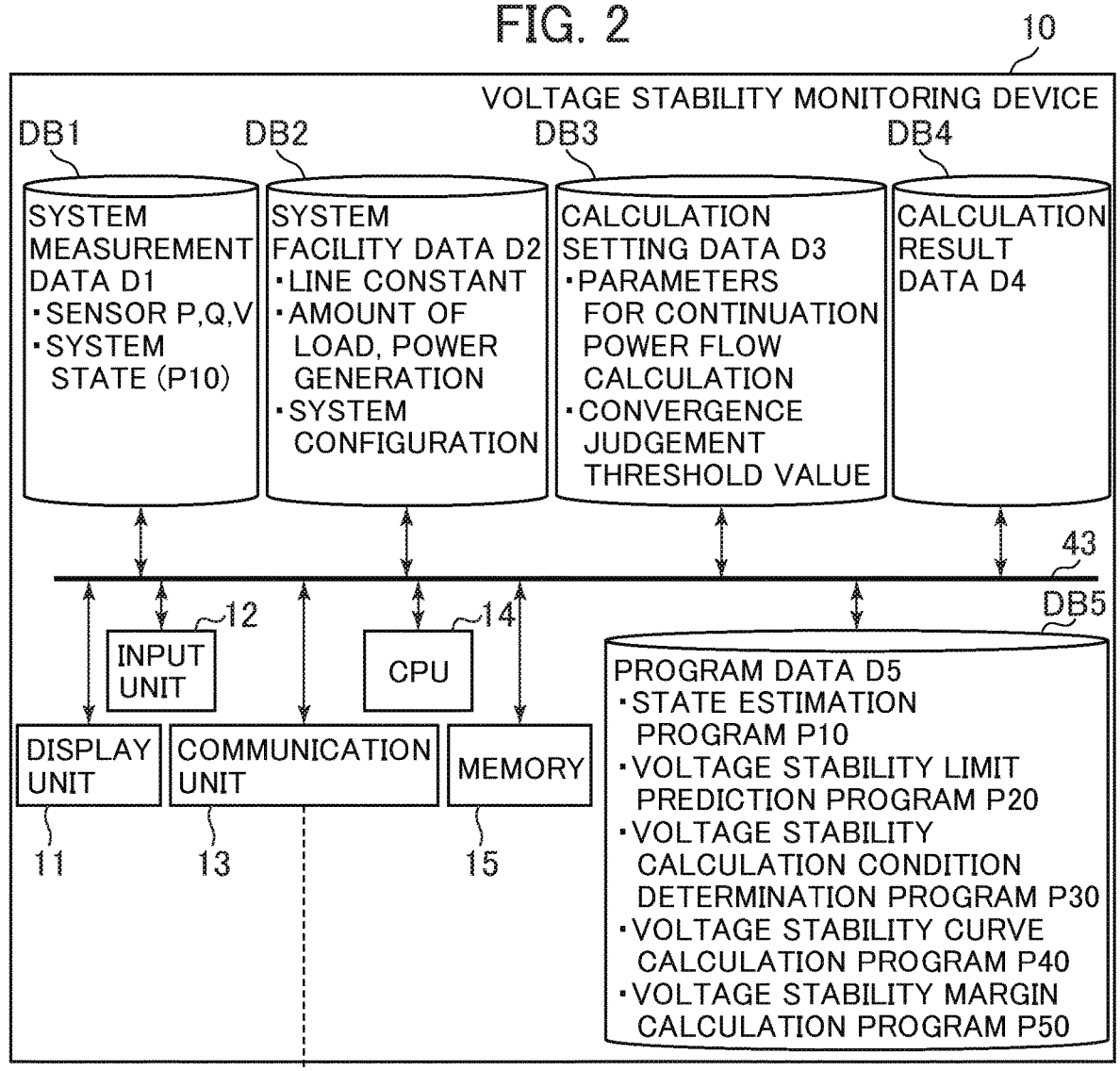
FIG. 2 is a view illustrating a hardware configuration of a voltage stability monitoring device and an example of an entire configurational example of an electric power system.

FIG. 2 illustrates a hardware configuration of a voltage stability monitoring device according to the present invention and an overall configuration of an electric power system to which the voltage stability monitoring device is applied. First, an example of an electric power system to which the voltage stability monitoring device of the present invention is applied is to be explained.

A typical electric power system means an electric power distribution system in a narrow meaning. An illustrated example of FIG. 2 shows an electric power system 100 in the narrow meaning, and the electric power system 100 includes a plurality of branches (lines) 140, nodes (buses) 120, etc. Further, the electric power system sometimes means an electric generation and distribution system in a broad meaning, which is connected from each of locations of the electric power system 100 by way of a transformer 130 and bus 121 to generator 110 or a load 150. Further, although not illustrated in the drawing, the system may include one or plurality of other instrumentation devices or controllable devices (battery, chargeable dischargeable secondary batteries, EV batteries, fly wheels, etc.).

A measurement device 44 is optionally provided in each portion of the electric power systems, and measurement data D1 are taken in by way of a communication network 300 to the voltage stability monitoring device 10 of the present invention. Accordingly, the measurement device 44, etc. are those provided with a communication function. The illustrated example shows a situation that the measured data D1 are obtained also from a generator 110, load 150, etc. in addition to the measurement device 44 provided to the electric power system 100 but the data can be inputted from optional portions.

In the configuration of the electric power system outlined above, examples of the power source 110 include a distributed power source such as solar power generation and wind power generation in addition to large power sources such as thermal power generators, hydraulic power generators, or nuclear power generators.

Further examples of the measuring device 44 include devices for measuring one or more of node voltage V, branch current I, power factor φ effective power P, and reactive power Q (for example, voltage transformer VT, power detector PT, current transformer CT, etc.,) and has a function of transmitting a data including data measurement location identification reference ID and a built-in time stamp of the measurement device (TM: telemeter) or the like). The device may also be a device for measuring electric power information with absolute time utilizing GPS (voltage phasor information), a phase measurement unit (PMU: Phase Measurement Units), or like other measurement equipment. Further the measurement device 44 has been described as it is present in the electric power system 100, it may be provided to a bus or a distribution line that is connected to the generator 110, the transformer 130, the measurement device 44, and the load 150.

The system measurement data D1 in the electric power system 100 is each of the data measured, for example, by the measurement device 44, and received and stored by way of the communication network 300 in the voltage stability monitoring device 10 according to the present invention. However, instead of directly receiving the measurement data D1 from the measurement device 44, the data may be once aggregated, for example, in the monitoring control device and then received by way of the communication network 300 to the system measurement database DB1, or may be received from both of the measurement device 44 and received by way of the communication network 300 to the system measurement database DB1. The system measurement data D1 preferably contains an inherent number for distinguishing the data and a time stamp.

Then, configuration of the voltage stability monitoring device 10 that intakes the system measurement data D1 and executes voltage stability calculation is to be described. The voltage stability monitoring device 10 is generally configured as a computer system.

According to the hardware configuration of the computer system illustrated in FIG. 2, the voltage stability monitoring device 10 includes a display unit 11, an input unit 12 such as a keyboard or a mouse, a communication unit 13, a computer or a computer server (CPU: Central Processing Unit) 14, a memory 15, and various databases DB and they are connected by way of a bus 43.

Among them, the various databases DB include, for example, an input database DB1 such as a system measurement database DB1 saving and holding the system measurement data D1, a system facility database DB2 holding the system facility data D2, an input database DB1 such as a calculation setting database DB3 holding the calculation setting data D3, a calculation result database DB4 for holding the calculation result data D4, and a program database DB5 for holding the program data D5.

The display unit 11 is preferably configured as a display device but may include a configuration of using a printer unit or a voice output unit instead of the display unit or together with the display device.

The input unit 12 can be configured by providing, for example, at least one of pointing units such as a keyboard switch or mouse, a touch panel, a voice instruction device, or the like.

The communication unit 13 has a circuit for connection with a communication network 300 and a communication protocol.

The CPU 14 reads and executes a predetermined computer program from the program database DB5. The CPU 14 may be configured as one or plurality of semiconductor chips or may be configured as a computer device such as a calculation server.

The memory 15 is configured, for example, as a RAM (Random Access Memory) and stores a computer program read out from the program database DB5 or stores calculation result data and image data necessary for each processing. The screen data stored in the memory 15 are sent to and displayed on the display unit 11. Examples of the display screen are to be described later.

Here, the memory contents of the program database DB5 are to be described. The program database DB5 in FIG. 2 shows the contents of the program data D5 of the voltage stability monitoring device 10, which contains, for example, a state estimation calculation program P10, a voltage stability limit prediction program P20, a voltage stability calculation condition determination program P30, a voltage stability curve calculation program P40, and a voltage stability margin calculation program P50.

The CPU 14 properly executes calculation program read out from the program database DB5 to the memory 15 (the state estimation calculation program P10, the voltage stability limit prediction program P20, the voltage stability calculation condition determination program P30, the voltage stability curve calculation program P40, and the voltage stability margin calculation program P50) sequentially and optionally to execute plausible calculation for the system state, prediction for the voltage stability limit, determination of the voltage stability calculation conditions, calculation for the voltage stability curve, calculation for the voltage stability margin, instruction of the image data to be displayed, data search in various databases, etc.

The memory 15 is a memory for once storing an image data for display, a calculation temporal data such as a calculation result data, and a calculation result data, which forms necessary data by the CPU 14 and displays the same on the display unit 11 (for example, display screen). The display unit 11 of the voltage stability monitoring device 10 may be a simple screen only for rewriting each of control programs or databases.

Then, detailed memory content in each of database DB is to be described. The voltage stability monitoring device 10 contains databases generally classified into five types. Here, a system measurement database DB1, a system facility database DB2, a calculation setting database DB3 and calculation result database DB4, are to be explained except for the program database DB5 which has already been explained.

The system measurement database DB1 stores, as the system measurement data D1, effective electric power P, reactive power Q, voltage V, voltage phase angle δ, current I, power factor φ, etc. They are preferably a data with time stamp or a PMU data. Specifically, the database stores, for example, a voltage and a voltage phase angle at a node 120a or 120b connected to the electric power system 100, a line power flow (P+jQ) at a branch 140a or 140b connected to the node 120a or 120b connected to the electric power system 100, a power flow (P+jQ) in a transformer 130a or 130b connected to the node 120a or 120b connected to the electric power system 100, a voltage V and a voltage phase angle δ at the node 120a or 121b connected to the transformer 130a or 130b, an effective power P, a reactive power Q, and a power factor φ of the load 150 or the power source 110 connected to the node 121a or 121b, and an effective power P, a reactive power Q, a power factor φ, a voltage V, a voltage phase angle δ, for example, of other node, branch, power source, the load, or the control device connected to the electric power system for measurement by way of the communication network from the measuring device 44, etc.

The voltage phase angle δ may be measured also by using other measurement equipment of utilizing PMU or GPS. The measurement device includes a voltage transformer VT, a power detector PT, etc. The power flow (P+jQ) can be calculated based on the current I measured by the voltage V and the power factor φ.

The system measurement database DB1 stores, as the system measurement data D1, also the plausible result of estimation calculation for effective power P, reactive power Q, voltage V, voltage phase angle δ, current I and power factor φ at each of nodes and branches, of generator, load, control equipment in a which the calculation result of the state estimation calculation is also stored as the program P10.

The system facility database DB2 stored a system configuration, line impedance (R+jX), a ground capacitance (admittance: Y), data necessary for the system configuration and the state estimation (threshold value of bad (data, etc.), generator data, and other data necessary for power flow calculation, state estimation, and voltage stability calculation and the system facility data D2. The measured value may be obtained directly from a measuring device of the entire system. When data are input manually, the data is manually input and stored by the input unit 12. Upon manual input, necessary image data are generated by the CPU 14 and displayed on the display unit 11. Upon the input, it may be set semi manually input such that a large amount of data can be set by utilizing complementally function.

The calculation setting database DB3 stores, as the calculation setting data D3, for example, one or more of fluctuation of voltage and power flow caused by output fluctuation and load fluctuation of regeneratable energy assumed in the electric power system, change or fluctuation of the power source configuration, fluctuation of load frequency characteristics and voltage characteristics, parallel-in and parallel-out of phase modifying equipment, fluctuation of power factor, fluctuation of restrictions in the generator output, the reactive power supplying equipment and the line power flow, change or fluctuation of system configuration in view of the system operation, fluctuation of the line impedance that fluctuates due to line temperature, wind velocity, or power flow amount, etc., fluctuation of the system configuration caused by accident or failure, for example, due to lightening thunder to the system, one or more setting values such as failure locations and failure modes as failure case assumed in the power system, fluctuation conditions of the voltage and the power flow amount caused by output fluctuation or load fluctuation of the assumed regeneratable energy, and the output fluctuation or load fluctuation of the assumed regeneratable energy, changing conditions or fluctuation conditions of the power source configuration, fluctuation conditions of the load frequency characteristics and voltage characteristics, parallel-in and parallel-out conditions of phase modifying equipment, fluctuation conditions of load power factor, fluctuation conditions of restriction of the generator output, the reactive power supply equipment, or power flow, changing conditions or fluctuation conditions of the system configuration in view of the system operation, fluctuation conditions of the line impedance that fluctuate due to line temperature, wind velocity, the power flow amount, etc., and the fluctuation conditions of the system configuration caused by accident or failure, for example, due to lightening thunder to the system, one or more setting values for buses and locations as monitoring target for voltages stability margin, parameters necessary for any one of calculations of repetitive power flow calculation method, a repetitive optimal power flow calculation method, a continuation power flow calculation method (continuation method), a geometrical parameterization technique for the continuation power flow calculation, an approximate calculation method based on the result of calculation of the geometrical parameterization technique for the power flow calculation method, the optimal power flow calculation, the repetitive power flow calculation method, the repetitive optimal power flow calculation method, the continuation power for calculation method and the continuation power flow calculation, and list in combination with convergence judgement threshold value. The respective technique and methods will be described later.

The output fluctuation of the assumed rechargeable energy includes output fluctuation in the solar power generation, wind power generation mega solar, wind firm, and simultaneous falling off of the wind firms. The failure case may include only a severe failure case depend on the system operation. The calculation setting data D3 may be set previously without using the input unit 12, or the set value may be set by way of the communication network 300 and the communication unit 13. Such setting method provides an advantageous effect capable of flexibly setting the calculation setting data D3.

Figure 1:
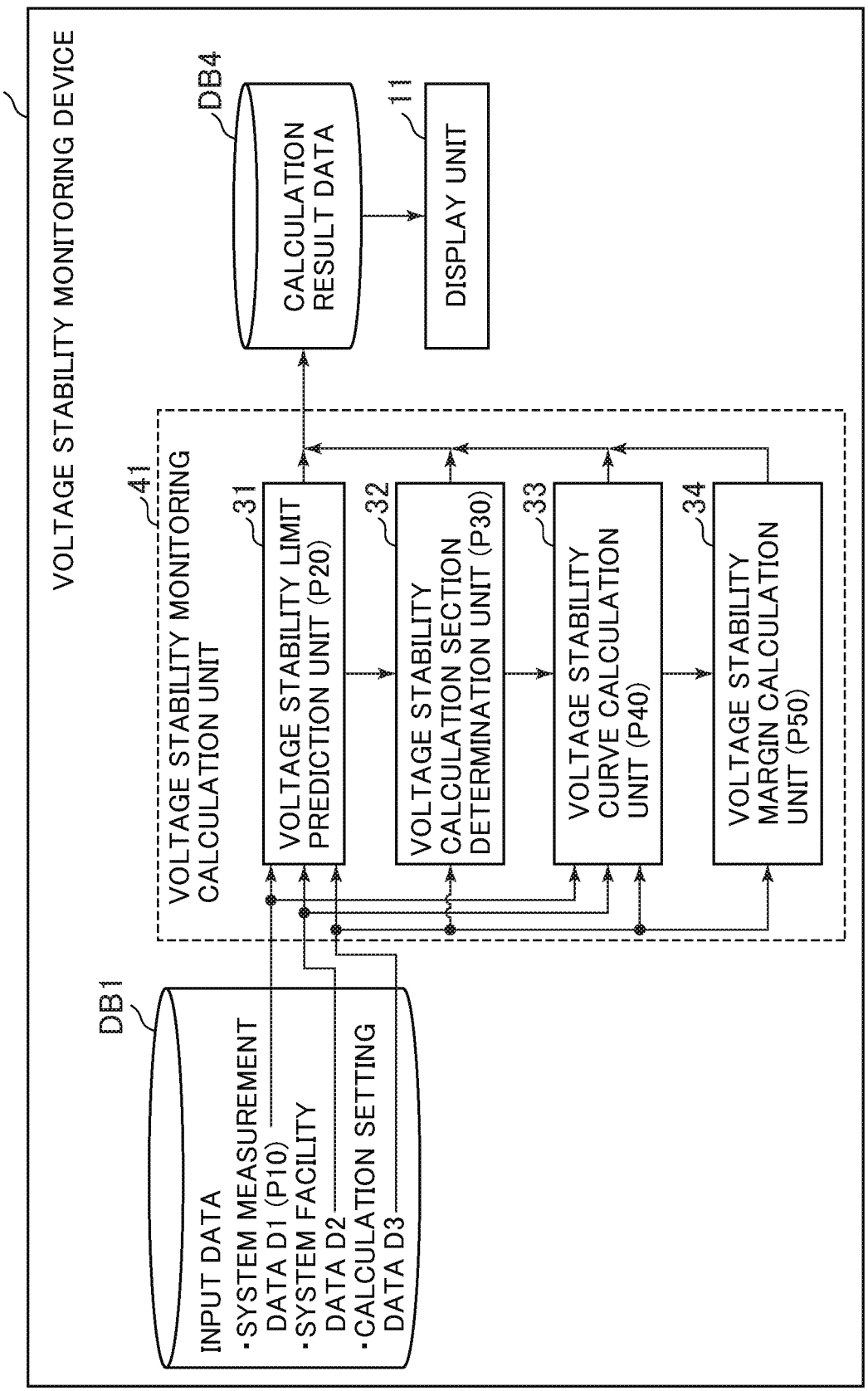
FIG. 1 is a view illustrating a software configuration in a case of configuring a voltage stability monitoring device with a computer system.

FIG. 2 shows a hard ware configuration in a case of configuring the voltage stability monitoring device 10 of the present invention with a computer system, and FIG. 1 shows a software configuration in a case of configuring the voltage stability monitoring device 10 with a computer system.

In the software configuration of FIG. 1, the input data stored in the input database DB1 (the system measurement data D1, the system facility data D2, and the calculation setting data D3) is stored as the calculation result data D4 in the calculation result data DB4, and a series of processing procedures in the voltage stability monitoring calculation unit 41 to be displayed on the display unit 11 are shown.

A series of the processing procedures in the voltage stability monitoring calculation unit 41 includes a voltage stability limit prediction unit 31, a voltage stability calculation condition determination unit 32, a voltage stability curve calculation unit 33 and a voltage stability margin calculation unit 34. The voltage stability limit prediction unit 31 executes the voltage stability limit prediction program P20, the voltage stability calculation condition determination unit 32 executes the voltage stability calculation condition determination program P30, the voltage stability curve calculation unit 33 executes the voltage stability curve calculation program P40, and the voltage stability margin calculation unit 34 executes the voltage stability margin calculation program P50.

The input data stored in the input database DB1 of the voltage stability monitoring device 10 includes the system measurement data D1, the system facility data D2 and the calculation setting data D3. The voltage stability unit prediction unit 31 as a first processing unit of the voltage stability monitoring calculation unit 41 executes voltage stability limit prediction calculation based on the voltage stability limit prediction program P20 by using the system measurement data D1, the system facility data D2 and the calculation setting data D3 of the input database DB1, and outputs the result of calculation to the calculation result data DB4. Further, the voltage stability calculation condition determination unit 32 determines the voltage stability calculation condition based on the voltage stability calculation condition determination program P30 by using the calculation result of a voltage stability limit prediction and outputs the calculation result to the calculation result data DB4. Further, the voltage stability curve calculation unit 33 calculates the voltage stability curve based on the voltage stability curve calculation program P40 by using the voltage stability calculation condition determination result of the calculation result data DB4, and outputs the calculation result to the calculation result data DB4. Further, the voltage stability margin calculation unit 34 calculates the voltage stability margin based on the voltage stability margin calculation program P50 by using the result of voltage stability curve calculation of the calculation result data DB4 and outputs the result of calculation to the calculation result data DB4. The display unit 11 displays one or more information in the calculation result data DB4 which stores the result of each of the calculations.

Through the processing described above, the calculation result database DB4 stores one or more of the plausible system state calculated by the state estimation calculation program P10, the prediction result of the voltage stability limit calculated by the voltage stability limit prediction program 20, the determination result of the voltage stability calculation condition calculated by the voltage stability calculation condition determination program P30, the calculation result of the voltage stability curve calculated by the voltage stability curve calculation program P40, and the calculation result of the voltage stability margin calculated by the voltage stability margin calculation program P50.

Figure 5A:
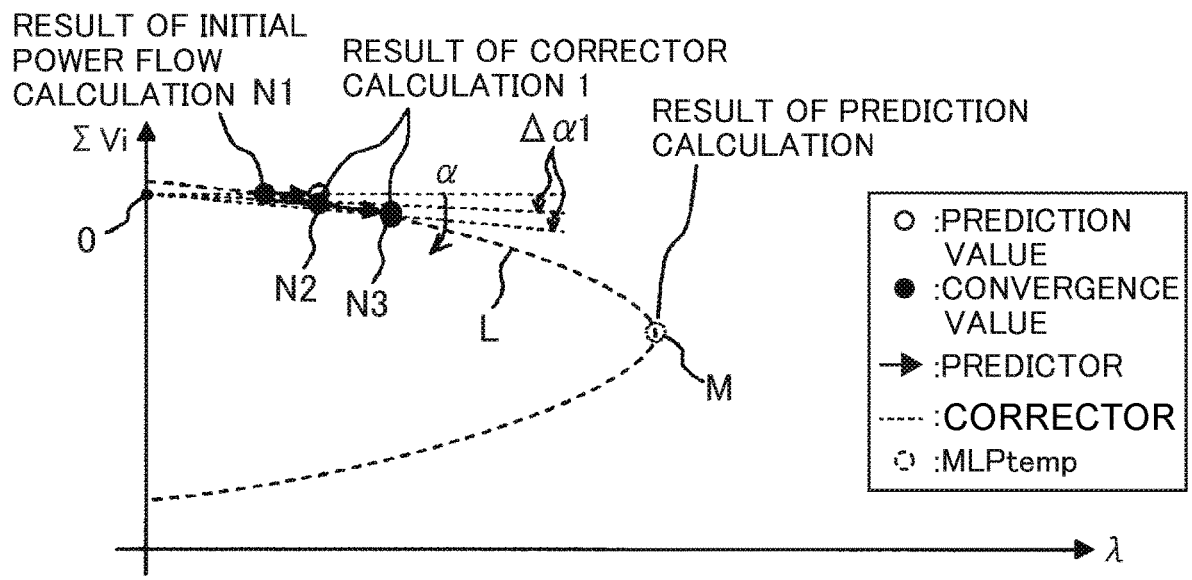
FIG. 5A is a diagram of a $\lambda$-$\Sigma V_1$ curve for explaining the concept of determining a voltage stability.
Figure 5B:
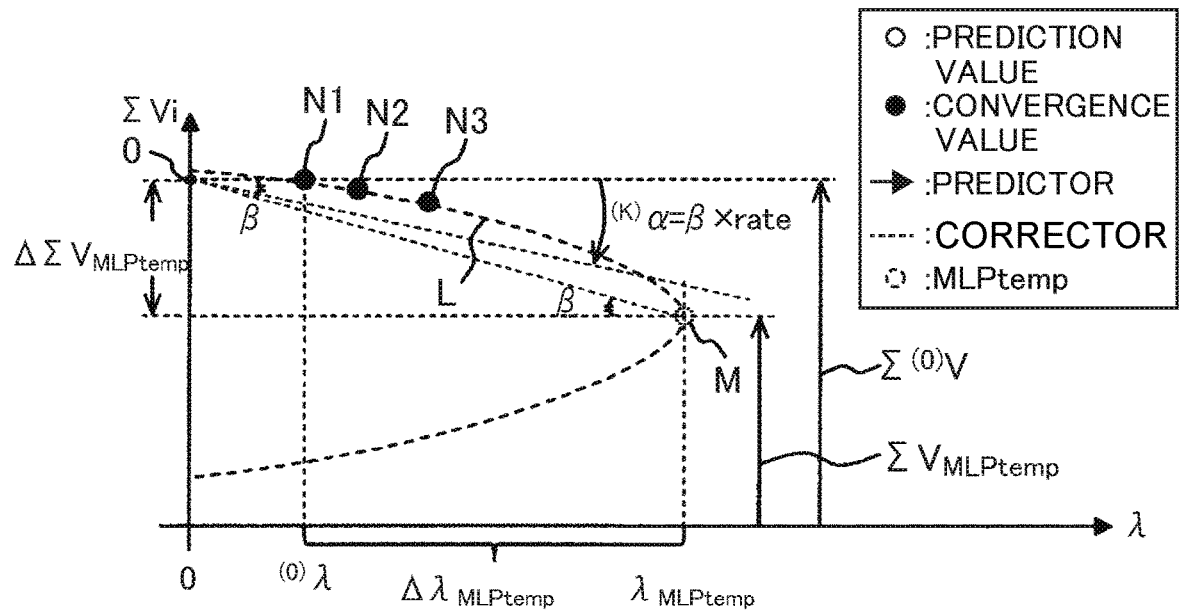
FIG. 5B is a diagram of a $\lambda$-$\Sigma V_1$ curve for explaining the concept of determining the voltage stability.

FIG. 5a, FIG. 5b and FIG. 6 are diagrams for explaining the concept of determining the voltage stability in the voltage stability monitoring device according to the present invention.

Generally, the voltage stability (stability or stabilization of voltage) is often evaluated by using a voltage stability curve. The voltage stability is a term for representing the stable extent of voltage in which the distance from an operational point to the maximum load point (MLP: Maximum Loading Point) is referred to as a load margin and the voltage stability is evaluated by using the voltage stability curve. MLP means a saddle node branch point or immediate instability point. In addition, the voltage stability can be evaluated also by using the gradient of the operational point on the voltage stability curve. As described above, the stability or stabilization property of the voltage can be evaluated by using the voltage stability curve.

There are various expressions representing the voltage stability curve and FIG. 5a, FIG. 5b and FIG. 6 show a $\lambda$-$\Sigma V_i$ curve as one examples of the voltage stability curve. The $\lambda$-$\Sigma V_i$ curve is a voltage stability curve represented by using a load parameter $\lambda$ on the abscissa and a sum of bus voltages $\Sigma V_i$ of the electric power system on the ordinate of the coordinate. The voltage stability curve includes several types depending on what are used for the abscissa and ordinate of the coordinate and, in addition, so-called P-V curve, $\lambda$-V curve, $\lambda$-Pa curve, and $\lambda$-$\theta$ curve, etc. are used. In this case, P is electric power, V is voltage, $\lambda$ is load parameter, Pa is an effective power loss in the entire power system, $\theta$ is a voltage phase angle. In the present invention they are collectively referred to as voltage stability curves and the present invention may be realized by using any one of the curves.

According to the characteristics shown by the voltage stability curves, there is a so-called nose curve relation between the electric power (load power) and the voltage which expresses that the voltage stability lowers when the maximum load point M at the top end of the nose is exceeded to bring about abnormal voltage lowering phenomenon. The maximum load point M at the top end of the nose is shifted due to factors, for example, fluctuation of voltage or power flow amount caused by output fluctuation or load fluctuation of a regeneratable energy, change or fluctuation of power source configuration, fluctuation of load frequency characteristics and voltage characteristics, fluctuation of load power factor due to parallel in and parallel out of phase modifying equipment, fluctuation of restrictions in the generator output, the reactive power supply equipment or line power flow, change or fluctuation of the power source configuration in view of the operation of the system, fluctuation of line impedance that varies due to line temperature, wind velocity, power flow amount, etc., fluctuation of system configuration caused by accident or failures owing to lightening thunder to the system (various kinds of accident in the power distribution lines, opening and closing of power distribution lines). Further, a larger electric power than the maximum load point at the nose top end cannot be distributed and since the voltage control system, for example, tap changing device is designed on the premise of the pending characteristics on the upper side of the curve, the voltage drops rapidly below the maximum load point at the nose top end to possibly cause voltage collapse which leads to distribution impossible.

Figure 13:
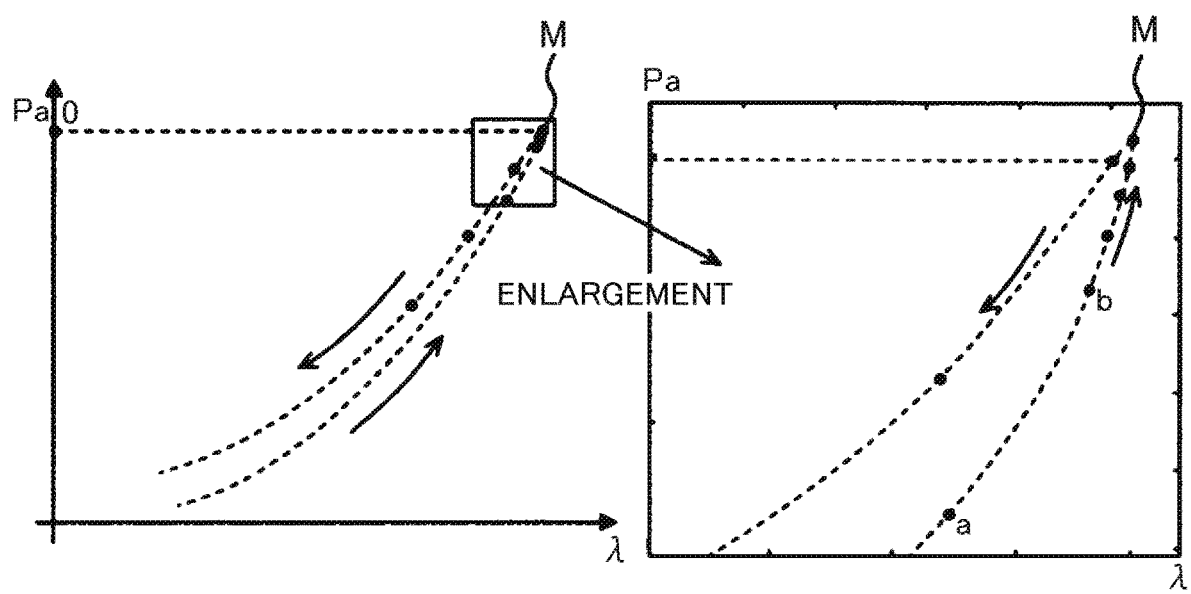
FIG. 13 is a diagram showing a λ-Pa curve as an example of typical characteristics of a voltage stability curve.
Figure 14:
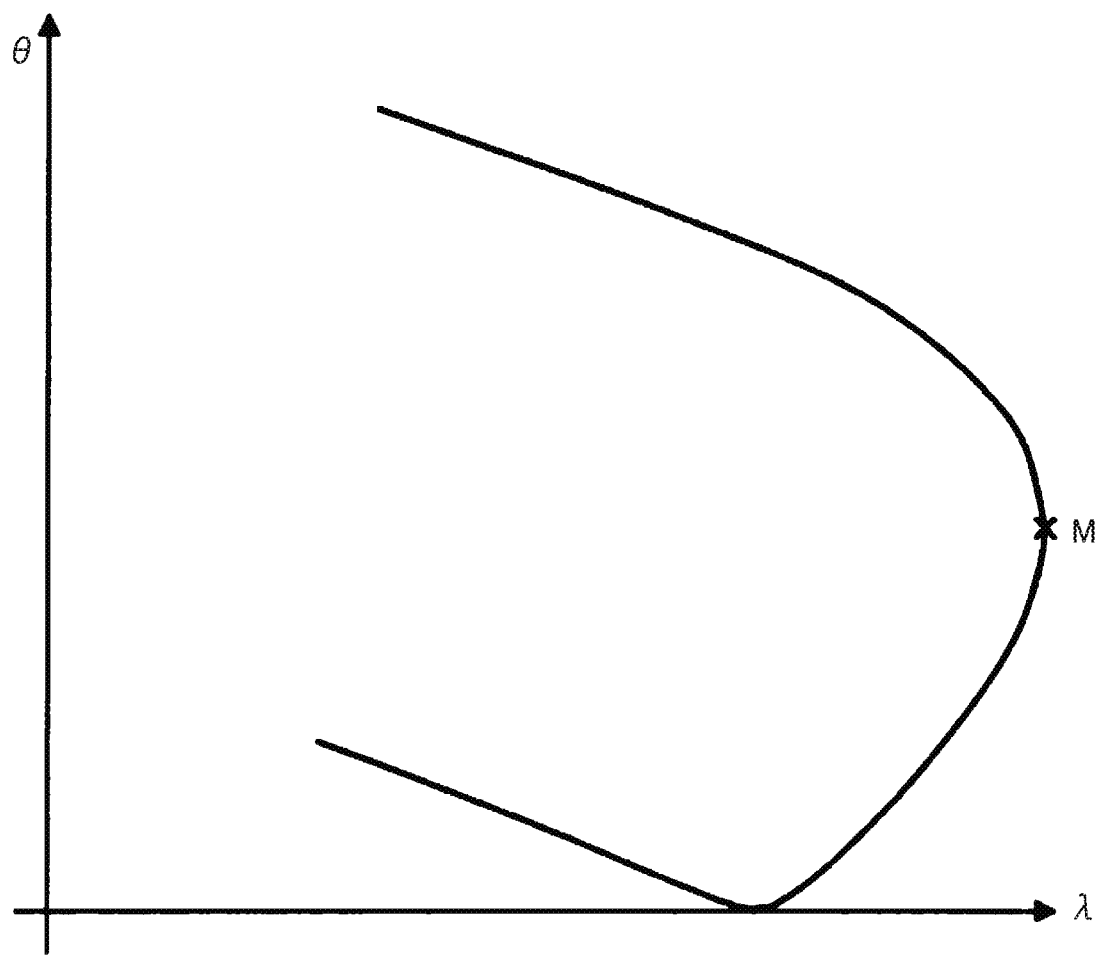
FIG. 14 is a diagram showing a λ-θ curve as a typical characteristic example of a voltage stability curve.

FIG. 13 and FIG. 14 show a $\lambda$-Pa curve and a $\lambda$-$\theta$ curve as other typical characteristic examples of the voltage stability curve. The $\lambda$-Pa curve in FIG. 13 uses load parameter $\lambda$ on the abscissa and the effective power loss Pa of the entire power system on the ordinate and has a maximum load point M at the top end position of the curve shown by a dotted line. The $\lambda$-$\theta$ curve in FIG. 14 has a load parameter $\lambda$ on the abscissa, the voltage phase angle $\theta$ on the ordinate and has a maximum load point M at the top end of the nose curve.

In the expression of the $\lambda$-Pa curve in FIG. 13, while the top end position of the characteristics is indicated as the maximum load point M at the nose top end, and the maximum of Pa (effective power loss in the entire electric power system) and the maximum of load parameter $\lambda$ do not sometimes agree depending on the actual system and, in this case, an a point just on this side of the illustrated point M in the drawing is the maximum load point (MLP).

In view of the above, in the voltage stability monitoring device according to the current invention, the position for the maximum load point at the nose top end on the voltage stability curve in the present state is estimated accurately and a margin relative to the current operational point (voltage stability margin) is determined accurately. While details of the graphs are explained later, the result of calculation determined by each of the programs means, in summary, to determine values at each of the following points in FIG. 5a, 5b, and FIG. 6.

For example, the result of prediction for the voltage stability limit calculated based on the voltage stability limit prediction program P20 determines values, for example, load parameters $\lambda$ at the maximum load point M at the top end of the nose in the $\lambda$-$\Sigma V_i$ curve L (load parameter $\lambda$ as the result of look-ahead method calculation in FIG. 5a and value for the sum $\Sigma V_i$ of the bus voltages of the electric power system, etc. and the values stored in the calculation result database DB4. This load parameter $\lambda$ means a load factor and load increment, etc. In the following case, an example of load parameter is represented for the load parameter $\lambda$ on the abscissa.

Further, the determination result for the voltage stability calculation condition calculated by the voltage stability calculation condition determination program P30 corresponds to determination of a value of the geometrical parameter $^{(k)}\alpha$ in FIG. 6 and the value is preserved in the calculation result database DB4.

Further, the calculation result of the voltage stability curve calculated by the voltage stability curve calculation program P40 corresponds to determination of the $\lambda$-$\Sigma V_i$ curve L calculated by the geometrical parameterization technique for the continuation power flow calculation as in FIG. 6 or P-V curve L in this case and the value is preserved in the calculation result database D.

The geometrical parameterization technique for the continuation power flow calculation, and the continuation power flow calculation method is a method of calculating a $\lambda$-$\Sigma V_i$ curve or a P-V curve by calculation of continuously effect an operation of varying the parameter, for example, as the load factor as an example of a load power P or load parameter $\lambda$ under a predetermined condition, thereby predicting the system state (predictor calculation) and determining corresponding bus voltage Vi and a load parameter $\lambda$ (load factor) by a power flow calculation (modifier calculation) by calculating operation continuously, thereby calculating a Vi curve P-V curve. Details of the geometrical parameterization technique for the continuous power flow calculation and the continuation power flow calculation method are to be described later. The predetermined conditions are, for example, conditions of multiplying $\lambda$ to all of the effective power load and reactive power load or a condition of increasing the load by uniformly multiplying $\lambda$ to particular effective power load and reactive power load.

Further, the calculation result of the voltage stability margin calculated by the voltage stability margin calculation program P50 corresponds to is determination of $\Delta\lambda_{MLP}=(\lambda_{MLP}-{}^{(0)}\lambda)$ or $\Delta\lambda_{MLP}=(\lambda_{MLP}-{}^{(0)}\lambda)/({}^{(0)}\lambda)$ or $\Delta P_{MLP}=(P_{MLP}-{}^{(0)}P)$ or $\Delta P_{MLP}=(P_{MLP}-{}^{(0)}P)/({}^{(0)}P)$ or $\Delta\Sigma V_{MLP}$ and the value is stored in the calculation result database DB4. Then, $\lambda_{MLP}$ is a load factor at the voltage stability limit MLP (Maximum Load Point M), ${}^{(0)}\lambda$ is a load factor as a result of initial power flow calculation, $P_{MLP}$ is the effective load power P and sum $\Sigma P$ of the load effective power at the voltage stability limit, and ${}^{(0)}P$ is a sum $\Sigma P$ of the load effective power P and the load effective power and sum $\Sigma P$ of the load effective power P and as a result of the initial power flow calculation, and $\Delta\lambda_{MLP}$, $\Delta P_{MLP}$ or $\Delta\Sigma V_{MLP}$ represent voltage stability margin.

Figure 3:
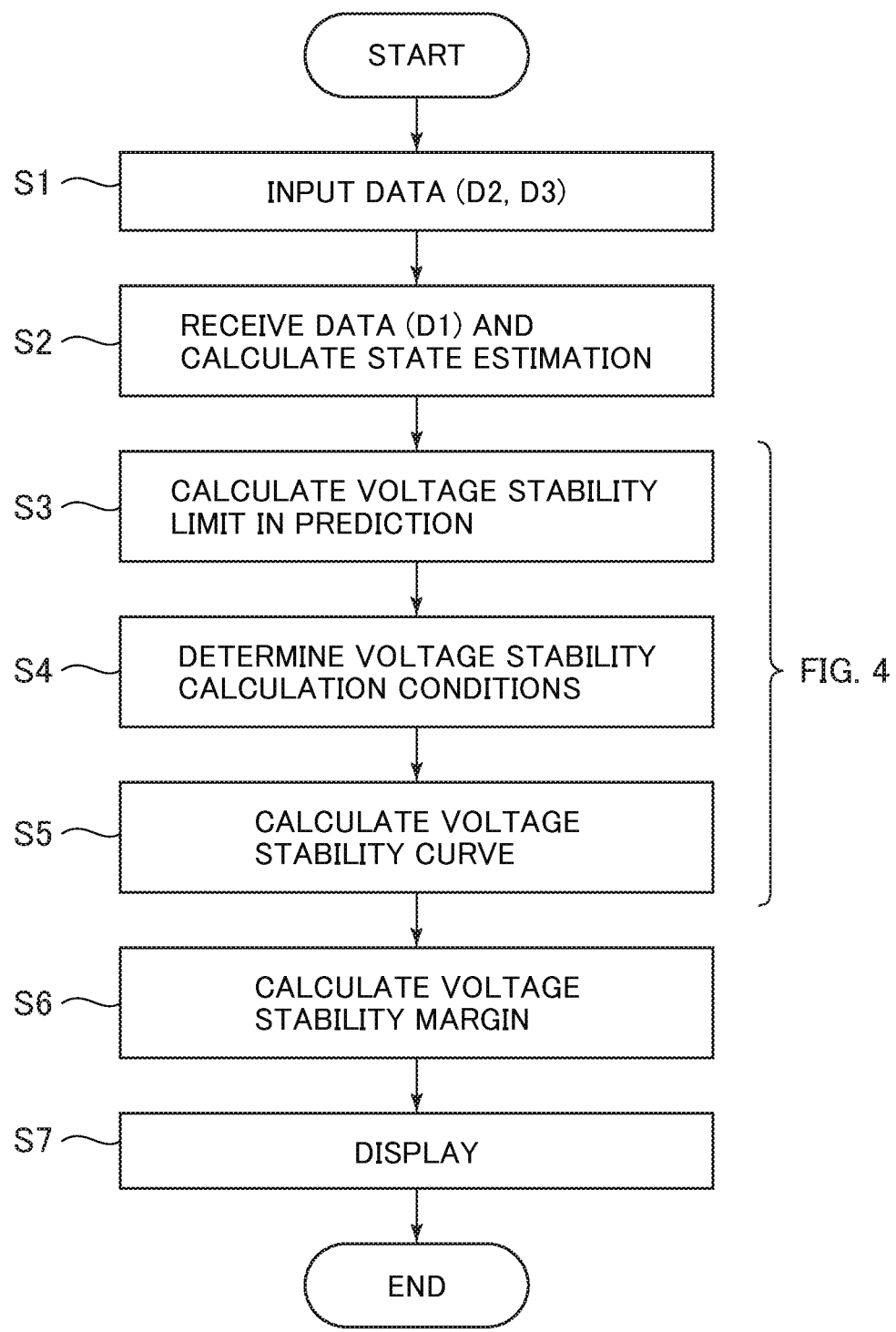
FIG. 3 is an example of a flow chart showing an entire processing by the voltage stability monitoring device.

Then, the content of calculation processing by the voltage stability monitoring device 10 is to be explained with reference to FIG. 3. FIG. 3 is an example of a flow chart illustrating the entire processing by the voltage stability monitoring device. First, the flow is to be explained simply.

In the processing step S1, after inputting and storing the system facility data D2 and the calculation setting data D3, the system measurement data D1 are received at the processing step S2, to execute state estimation calculation by using the system measurement data D1, the system facility data D2, and the calculation setting data D3, to store the result of the state estimation calculation (stored in the calculation result database DB4).

Next, at the processing step S3, prediction calculation is effected for the voltage stability limit (point M in FIG. 5a) based on the system measurement data D1, the system facility data D2, and the calculation setting data D3 of the input database DB1 to store the result of the prediction calculation for the voltage stability limit (stored in the calculation result database DB4).

Then, at the processing step S4, the voltage stability calculation condition (geometrical parameter αi in FIG. 6) is determined by using the calculation result of the voltage stability limit prediction, to save the calculation result of the voltage stability calculation condition determination (stored in the calculation result database DB4).

Then, at the processing step S5, the voltage stability curve (voltage stability curve L in FIG. 6) is calculated by using the calculation result of the system measurement data D1, the system facility data D2, and the calculation setting data D3 of the input database DB1, to save the result of calculation for the voltage stability curve (stored in the calculation result database DB4).

Then, at the processing step S6, the voltage stability margin is calculated by using the result of calculation for the voltage stability curve, to save the result of calculation for the voltage stability margin (stored in the calculation result database DB4).

Finally, at the processing step S7, various calculation results and data accumulated in the memory in the course of the calculation are preferably displayed successively on the display screen. Thus, the operator can easily recognize the operation situation or the voltage stability monitoring device 10. Thus, the operator can easily recognize the operation situation of the voltage stability monitoring device 10. Till the change of the monitoring location is effected, the screen display for the situations from receiving various data to sending of various calculation results is repeated.

When the series of processing described above is explained simply, a voltage stability limit (point M in FIG. 5a) is determined temporarily in the processing step S3, a voltage stability calculation condition for executing detailed search near the voltage stability limit point M is in the processing step S4 is set (geometrical parameter αi in FIG. 6), to determine the coordinate for the maximum load point M as a result of detailed search and, accordingly, the voltage stability curve L is determined, at the processing step S5.

The flow of the processing described above is to be described more specifically on every processing step. First, in the processing step S1, if the system facility data D2 and the calculation setting data D3 are not previously set, the system facility data D2 and the calculation setting data D3 are inputted by using the input unit 12 and the display unit 11. When inputting, the data may be inputted from the measuring unit 44 and the network 300 through the communication unit 13, or the system facility data D2 and the calculation setting data D3 preserved, for example, in the monitoring control device may be automatically received at a constant period and saved. Further, when the system facility data D2 and the calculation setting data D3 are previously set, modification may be added or the data may be used as it is.

In the processing step S2, the system measurement data D1 is received, the state estimation calculation is executed by using the system measurement data D1, the system facility data D2, and the calculation setting data D3 to save the result of state estimation calculation in the calculation result database DB4.

Also the plausible result of estimation calculation for each of node, branches, generators, loads, effective power P of the control equipment, reactive power Q, voltage V, voltage phase angle δ, current I, and the power factor φ of the system are stored as the measurement data. The method of state estimation calculation can be executed, for example, according to the calculation method described in "Lars Holten, Anders Gjelsvlk, Sverre Adam, F. F. Wu, and Wen-Hs lung E. Liu, "Comparison of Different Methods for State Estimation", IEEE Transaction on Power Systems, Vol. 3, pp. 1798-1806, 1988".

In the processing step S3, the voltage stability limit prediction calculation is executed by using the system facilitate D2 and the calculation setting data D3 saved in the processing step S1 and the state estimation result determined in the processing step S2, and the result is saved in the calculation result database DB4. Valves, for example, of the load parameter $\lambda$ at the nose end M of the $\lambda = \Sigma V_i$ curve and a sum $\Sigma V_i$ of bus voltages of the electric power system are calculated and saved. This is provisional determination for the nose end M of the $\lambda$-$\Sigma V_i$ curve.

The method of the voltage stability limit prediction calculation can be performed by using a method of combining calculation methods, for example, the power flow calculation method described in "WILLIAM F TINNEY, CLIFFORD E HART, "Power Flow Solution by Newton's Method", IEEE Transaction on Power APPARATUS AND SYSTEMS, VOL. PAS-86, NO. 11, pp. 1449-1967, 1967" and Look-Ahead method described by "Chiang. H. D. et al., "Look-Ahead Voltage and Load Margin Contingency Selection Functions for Large-Scale Power Systems And Systems", IEEE Trans. on Power Systems, Vol. 12, No. 1, pp. 173-180, 1997", using a method of roughening calculation accuracy by taking a large calculation step or geometrical parameter in the continuous power flow calculation method described, for example, in [Chiang. H. D. et al., "CPFLOW: A Practical Tool for Tracing Power System Steady-State Stationary Behavior Due to Load and Generation Variations", IEEE Trans. on Power Systems, Vol. 10, No. 2, pp. 623-634, 1995, Japanese Unexamined Patent Application Publication H06-153397 or using a method of roughening calculation accuracy by taking a large calculation step or geometrical parameter in the continuous power flow calculation method described, for example, in "Bonini Neto A. et al., "Technique for Continuation Power Flow Using the "Flat Start" and for Ill-Conditioned Systems", World Journal Control Science and Engineering, Vol. 3, No. 1, pp. 1-7, 2015, or based on the direct calculation method for the branch, maximum load point described in "Yorino Naoto", "The electric power system voltage stability and the trend of analysis technique", Electrical Engineers of Japan B, Vol. 123, No. 7, pp. 805, 2003". The power flow calculation method is based on the AC method but a DC method or power flow method may also be used.

In the processing step S4, the voltage stability calculation conditions are determined by using the system facility data D2 and the calculation setting data D3 stored in the processing step S1 and the calculation result of the voltage stability limit prediction determined in the processing step S2 and calculation result of the voltage stability limit prediction stored in the step S3 result is stored in the calculation result database DB4.

In the processing step S5, the voltage stability calculation conditions are determined by using the system facility data D2 and the calculation setting data D3 stored in the processing step S1 and the calculation result of the voltage stability limit prediction determined in the processing step S2 and calculation result of the voltage stability limit prediction stored in the step S4 result is stored in the calculation result database DB4.

Here, the flow of calculation in the processing steps S3 to S5 is described specifically on each on the processing steps with reference to FIG. 4. FIG. 4 is an example of a flow chart that specifically explains the processing in the voltage stability limit prediction unit 31, the voltage stability calculation condition determination unit 32 and the voltage stability curve calculation unit 33. In FIG. 4, the processing by the voltage stability unit prediction unit 31 is explained through specific processing steps S31 to S36 corresponding to the processing step S3 in FIG. 3, the processing by the voltage stability calculation condition determination unit 32 is explained through the specific processing steps S41 to S42 corresponding to the processing step S4 in FIG. 3, and the processing by the voltage stability curve calculation unit 33 is explained through detailed processing steps S51 to S54 corresponding to the processing step S5 in FIG. 3.

In the processing step S31, the system facility data D2, the calculation setting data D3 stored in the processing step S1 and the state estimation result determined in the processing step S2 are read in the memory 15. If a calculation setting data D3 contains an assumed failure list one of not yet selected failure is selected from the list, for example, of assumed failure read out to the memory 15. Explanation is to be made to a case with no fluctuation, for example, assumed failure in this case.

An initial power flow calculation is executed based on each of data read in the memory 15 and the result is saved in the memory 15. The initial power flow calculation is executed, for example, according to the methods described in the literatures of the power flow calculation method. The result of the initial power flow calculation is at the initial flow calculation result point N1 in FIG. 5a, which is represented as "$^{(1)}\lambda, \Sigma^{(1)}V_i$" on the coordinate.

Then, the geometrical parameter $^{(1)}\alpha$ is determined. This is a geometrical parameter used in a case of using geometrical parameterization technique for the continuation power flow calculation (PCTF (: Geometrical Parameterization Techniques for Continuation Power Flow)) described previously.

Now, the method of using the geometrical parameterization techniques for the continuation power flow calculation is to be explained. The geometrical parameter $^{(1)}\alpha$ is determined according to the following equation by using a coordinate ($^{(1)}\lambda, \Sigma^{(1)}V_i$) at the N1 point of the calculation result of the initial power flow and a coordinate (0, $\Sigma^{(0)}V_i$) at the 0 point as a reference point brought to the original point of the abscissa $\lambda$ kept at an identical height for the ordinate $\Sigma V_i$. Here, $^{(1)}\alpha$ is an initial value of the geometrical parameter.

[Formula 1]

$$^{(1)}\alpha = \frac{(\sum^{(1)}V_i - \sum^{(0)}V_i)}{(^{(1)}\lambda - ^{(0)}\lambda)} \quad (1)$$

Here, the description is made based on a $\lambda$-$\Sigma V_i$ curve in FIG. 5a. When other voltage stability curves are adopted, the ordinate may not be $\Sigma V_i$ but may be an effective power loss Pa in the entire electric power system, a voltage phase angle $\theta$ at a node in the electric power system, etc.

Then, the ordinate item [y] is mathematically expressed as in the formula (2).

[Formula 2]

$$[y] = \begin{cases} y_i \\ \sum y_i \\ (\sum y_i)/n \\ \|y\|_2 \\ \|y\|_3 \\ \|y\|_\infty \end{cases} \quad (2)$$

The ordinate item [y] in the formula (2) may be, for example, a voltage V or a voltage phase angle $\theta$ at a certain node, a sum of a voltage V at all or plural nodes, a value of a sum of a voltage V at all or plural nodes divided by an initial value of a voltage at all or plural nodes or a number of objection nodes (expressed mathematically as n). Alternatively, it may be a 2 norm of a voltage at one or more nodes a 3 norm of a voltage at one or more nodes or may be an infinite norm of one or more nodes. Further, point 0 may be taken on an original point (0.0) of a $\lambda$-$\Sigma V_i$ plane.

For example, in a case of adopting a $\lambda$-Pa curve illustrated in FIG. 13 as a voltage stability curve, the ordinate represents the effective power loss Pa for the entire electric power system. When the ordinate represents the effective power loss Pa for the entire electric power system, the formula (1) is represented as is the formula (3).

[Formula 3]

$$^{(1)}\alpha = \frac{(^{(1)}P_a - ^{(0)}P_a)/^{(1)}P_a}{(^{(1)}\lambda - ^{(0)}\lambda)} \quad (3)$$

In the formula (3), the effective power loss $P_a$ is determined according to the formula (4).

[Formula 4]

$$P_a(V, \theta) = \sum_{i \text{ and } j=\Omega} G_{ij}\{V_i^2 + V_j^2 - 2V_iV_j\cos\theta_{ij}\} \quad (4)$$

In the formula (4), Gij is a conductance between nodes i and j, Vi is a voltage at node i, Vj is a voltage at node j and $\theta$ij is a voltage phase difference between nodes i and j. For the formula (4), the voltage is processed in a polar coordination system but it may be processed in an orthogonal coordination system.

Further, in a case of adopting a $\lambda$-$\theta$ (voltage phase angle) curve illustrated, for example, in FIG. 14 as a voltage stability curve, when the ordinate represents the voltage phase angle $\theta$ at a certain node, in the case where the node of the voltage phase angle $\theta$ is for s node of the ordinate, the formula (1) is as shown in the formula (5).

[Formula 5]

$$^{(1)}\alpha = \frac{(^{(1)}\theta_i - ^{(0)}\theta_i)}{(^{(1)}\lambda - ^{(0)}\lambda)} \quad (5)$$

Here, $\theta$i is a voltage phase angle at a vulnerable bus node, setting a unit, for example, by degree. The vulnerable bus node means a bus having the lowest node end when node curves in plural buses are drawn as the voltage stability curve. For the bus, it can be said that dropping of voltage is sooner compared with other buses relative to a node parameter. The vulnerable bus node in a case of a $\lambda$-$\theta$i curve and a $\lambda$-Pa curve is somewhat different in view of the configuration of the curve but they may be considered similarly to that described above.

In FIG. 4, the processing step S32 shows initialization processing of series of processing repetitively executing a series of processing continuously in which k is a counter of a loop upon determining a convergence point (k=1 for first point) and l used in the mathematical formula is a counter upon convergence calculation by an N-R method for determining one convergence point. The counter l necessary for loop calculation in the modifier calculation is always initialized in the processing in the modifier calculation block. Values such as $\Delta\alpha 1$ and $\Delta\alpha 2$ used in the formula are previously set before starting.

Initialization of parameters necessary for subsequent calculation is executed at this processing timing.

The geometrical parameter $\alpha$ in the formula (5) means angle between each of a plurality of straight lines passing a reference point on the coordinate representing the voltage stability curve.

At the processing step S33, $^{(k+1)}\alpha$ necessary for determining a power flow calculation solution at or after the 2nd point is determined according to the following equation.

[Formula 6]

$$^{(k+1)}\alpha = {}^{(k)}\alpha - \Delta\alpha 1 \qquad (6)$$

Here, $^{(k+1)}\alpha$ is a geometrical parameter value upon corrector calculation at a point k+1, $^{(k)}\alpha$ is a geometrical parameter value upon corrector calculation at a point k, $\Delta\alpha 1$ is a value of increasing the geometrical parameter value $^{(k)}\alpha$ at a point k upon corrector calculation from the point k to the point k+1. Increment of $\Delta\alpha 1$ each by one means such a relation that the slope of a straight line drawn so as to pass the convergence point N1 as a result of the initial power flow calculation increases each by $\Delta\alpha 1$ from the point O in FIG. 5a. In the formula (6), $\Delta\alpha 1$ is a positive value.

The processing step S34 executes predictor calculation and corrector calculation of the geometrical parameterization technique in the continuation power flow calculation. Here, details for the predictor calculation and the corrector calculation of the geometrical parametrization for the continuation power flow calculation are to be described. In FIG. 5a, FIG. 5b, and FIG. 6, "○" represents a prediction value, "•" represents a convergence value, a solid allow "→" represents the direction of the predictor, and a dotted line represents the direction of the corrector. Further, a dotted circle means MLPtemp representing the position for the maximum load point M. MLP represents a voltage stability limit.

First, the predictor calculation is to be explained. The purpose of the predictor is to obtain a prediction point (=prediction value) for obtaining the next solution. Since, the prediction point is an initial value of the modifier calculation (power flow calculation), as the quality of the prediction point is higher, the repetitive calculation of the modifier for obtaining an exact solution is shorter.

The predictor calculation method can be generally classified into that by a linear predictor and by a non-linear predictor. Further, the linear predictor includes (a) a simple predictor, (b) a secant predictor, (c) a tangential predictor, etc. and the non-linear predictor generally includes (d) a non-linear predictor, and a predictor calculation may be executed in combination of one or plurality of predictors. (a) The simple predictor is a method of determining a prediction point by simply increasing or decreasing the parameter on the abscissa or the ordinate such as a voltage x or a load parameter $\lambda$ for one nearest solution. (b) The secant predictor is a method of drawing a secant line passing a convergence point at the last time ($\lambda'$, $\Sigma V_i'$) and a convergence point on the time before the last ($\lambda''$, $\Sigma V_i''$), increasing the parameters on the abscissa and the ordinate, and determining the predictor point on the straight line as shown by Mori, et al. in "Continuation power flow calculation using Lagrange interpolation predictor" in "Electric and Engineer of Japan B, vol. 123, Ni, 4. 2003. (c) The tangential predictor is a method of drawing a tangential line to a P-V curve conversion point at the last time and increasing the parameters on the abscissa and the coordinate, thereby determining the prediction point on the straight line as shown in a Continuation Power Flow Practical System Development" by Fukuyama, et. al., national meeting of the Institute of Electrical Engineers of Japan, No. 1387, 1997". (d) The non-linear predictor is a method of drawing a polynomial curve by using convergence points at the time before last, increasing the parameters on the abscissa and the ordinate, thereby determining a prediction point on the polynomial curve as shown in "Continuation power flow calculation using Lagrange interpolation non-linear predictor: Mori, et. al. the Institute of Electrical Engineers of Japan, vol. 123, No. 4, 2003" and "A. Bonini Neto, et al., "DEVELOPMENT AND ASSESSMENT OF NONLINEAR PREDICTORS FOR CONTINUATION METHOD", International Journal of Engineering and Applied Sciences, Vol. 5, No. 01, pp. 1-9, 2014".

Calculation using (a) a simple predictor and (b) a secant method predictor are to be described in the followings. A prediction point is determined (a) by using the simple predictor only at the first step, and (b) the secant method predictor is used for calculation at and after the second step for decreasing the calculation amount. This is because at least two points of convergence solutions are necessary for drawing a secant. The predictor point can be determined by simple calculation by the combination of two predictor calculations, to provide an effect capable of decreasing the calculation amount.

A formula (7) represents a predictor calculation formula of (b) using the secant method or the tangential method. $[^{(k)}x^T \, {}^{(k)}\lambda]$ is a power flow calculation solution at point k, $[^{(k+1)}x^T \, {}^{(k+1)}\lambda]^T$ is an initial value of the modifier calculation at k+1 step using the prediction value vector, and $\sigma$ is a predictor step width.

[Formula 7]

$$\begin{bmatrix} {}^{(k+1)}x \\ {}^{(k+1)}\lambda \end{bmatrix} = \begin{bmatrix} {}^{(k)}x \\ {}^{(k)}\lambda \end{bmatrix} + \sigma t \qquad (7)$$

Further, in the formula (7), t is a gradient vector at the point k determined by the secant method and the tangential method determined in the formula (8). Here, $[^{(k)}x^T \, {}^{(k)}\lambda]^T$ is a power flow calculation solution at the point k and $[^{(k-1)}x^T \, {}^{(k-1)}\lambda]^T$ is a result of modifier calculation at the step k−1. Thus, the width between the last time and the time before the last forms the step width of the next predictor method, making efficient search possible.

[Formula 8]

$$t = \begin{bmatrix} {}^{(k)}x \\ {}^{(k)}\lambda \end{bmatrix} - \begin{bmatrix} {}^{(k-1)}x \\ {}^{(k-1)}\lambda \end{bmatrix} \qquad (8)$$

$\sigma$ may be fixed and when it is judged as non-convergence or not-yet convergent, it may be bisected by a binary search method. Upon $\sigma$ calculation, $\sigma$ may be calculated while controlling variably considering the voltage, number of convergence calculation cycles, etc. In the case of the secant method, since prediction point cannot be calculated unless two convergence points are present, a method of not considering the increase for the ΣVi axis but considering only the increase in the λ axis for the 1$^{st}$ point may be enveloped.

Further, σ may be calculated by using the formula (9) shown below.

[Formula 9:

$$\sigma = {}^{(0)}\sigma / \|t\|_2 \qquad (9)$$

Here, $(0)\sigma$ is a previously set initial step width and $\|t\|_2$ is a 2 norm of t. The following equation is an example of a method as shown in "E. E. Nino et al., "Continuation Load Flow Using Automatically Determined Branch Megawatt Losses as Parameters", IEE Proc.-Gener. Transm. Distrib., Vol. 153, No. 3, pp. 302, 2006", example of the method.

Then, the modifier calculation method is to be explained. First, a load parameter the power flow formulation is formulated as in the formula (10), considering (load factor) λ as a variant. However, x is a variant vector arranging bus voltage values and λ is a load parameter.

[Formula 10]

$$G(x,\lambda)=0 \qquad (10)$$

x in the formula (10), the extent of voltage and the phase angle vector of the voltage may be processed in the polar coordination system, or may be processed with a real part e for the voltage vector and the imaginal part f for the voltage vector in the orthogonal coordination system, as shown in the formula (11)

[Formula 11]

$$x = \begin{cases} [V^T \ \delta^T]^T \\ [e^T \ f^T]^T \end{cases} \qquad (11)$$

The formula (10) specifically includes the following three formulas (12), (13) and (14). In the formulas, x is for a voltage vector, λ for a load parameter, ΔP (x, λ) and ΔQ (x, λ) for functions representing mismatch between the designated values of effective power and reactive power and the calculated value of the electric power equation, Δ|v| for a function representing the difference between the designated voltage value and the calculated voltage value, $P^{esp}$ and $Q^{esp}$ for a prediction designated value of the effective power and the reactive power at a load parameter λ, $V^{esp}$ for prediction designated value of the node voltage, a $P^{cal}$ and $Q^{cal}$ for calculation values of the effective power and the reactive power at the voltage vector x, $P^{sp}{}_{gen}$ and $Q^{sp}{}_{gen}$ are designated values for the effective power and the reactive power of the generator, $P^{sp}{}_{load}$ and the $Q^{sp}{}_{load}$ for designated values of the load effective power and reactive power, $k_{pg}$ for a prediction designated parameter of the effective power of the generator for adjusting the prediction value of the effective power of the generator, $k_{p1}$ and $k_{q1}$ for prediction designated value parameters of the load effective power and reactive power for adjusting the prediction values of the load effective power and reactive power, and |V| for an extent of the voltage calculation value.

[Formula 12]

$$\Delta P(x,\lambda)=\{P^{esp}(\lambda)\}-P^{cal}(x)=\{\lambda k_{pg}P_{gen}{}^{sp}-\lambda k_{pl}P_{load}{}^{sp}\}-P^{cal}(x)=0 \qquad (12)$$

[Formula 13]

$$\Delta Q(x,\lambda)=\{Q^{esp}(\lambda)\}-Q^{cal}(x)=\{Q_{gen}{}^{sp}-\lambda k_{pl}Q_{load}{}^{sp}\}-Q^{cal}(x)=0 \qquad (13)$$

[Formula 14]

$$\Delta|V|^2 = V^{esp^2} - |V|^2 = 0 \qquad (14)$$

When the load voltage characteristics are taken into consideration, formulas (15) and (16) are used instead of the formulas (12) and (13).

[Formula 15]

$$\Delta P(x, \lambda) = \left\{\lambda k_{pg}P_{gen}^{sp} - \lambda k_{pl}\left(\frac{V}{{}^{(0)}V}\right)^{Kpv} P_{load}^{sp}\right\} - P^{cal}(x) = 0 \qquad (15)$$

[Formula 16]

$$\Delta Q(x, \lambda) = \left\{Q_{gen}^{sp} - \lambda k_{pl}\left(\frac{V}{{}^{(0)}V}\right)^{Kqv} Q_{load}^{sp}\right\} - Q^{cal}(x) = 0 \qquad (16)$$

The formulas (12) and (13) can be simulated for the constant power characteristics with no fluctuation of the load depending on the voltage. When the load has characteristics changing depending on the voltage, evaluation accuracy of the voltage stability of the electric power system can be improved by using the formulas (15) and (16). In the formulas, parameters different from those of the formulas (12) and (13) are to be described. V represents the extent of voltage, $^{(0)}V$ is an extent of the voltage as a calculation result of the initial power flow calculation, $K_{pv}$ and $K_{pv}$ are voltage characteristics constant of the load effective power and the reactive power. For the formulas (15) and (16), formulas giving the voltage characteristics constant by means of exponent are shown but a ZIP model or the like may also be used. In this case, $K_{pv}=0$ and $K_{qv}=0$ are referred to as constant power load, $K_{pv}=1$ and $K_{qv}=1$ are referred to as constant current land and $K_{pv}=2$ and $K_{qv}=2$ are referred to as constant impedance load. However, since various loads are introduced in the actual system, it does not often show integers such as 0, 1, 2 of different values of $K_{pw}$ and $K_{qv}$.

Further, the formulas (17) and (18) are the formulas showing $P^{cal}$ and $Q^{cal}$ of the formula (15) and (16), which are shown by the polar coordination system.

[Formula 17]

$$P^{cal}(x) = P^{cal}(V, \delta) = \sum_{j=1}^{n} Y_{ij}V_iV_j\cos(\delta_i - \delta_j - \theta_{ij}) \qquad (17)$$

[Formula 18]

$$Q^{cal}(x) = Q^{cal}(V, \delta) = \sum_{j=1}^{n} Y_{ij}V_iV_j\sin(\delta_i - \delta_j - \theta_{ij}) \qquad (18)$$

In the formulas, Yij is an admittance between nodes i and j, $V_i$ is a voltage at a node i, Vj is a voltage at a node j, δi represents a voltage phase angle at a node i, δj is a voltage phase angle at a node j, and θij is a voltage phase angle difference between the nodes i and j. Usually, formulas (12), (13) and (15), (16) are used for s bus such as a load bus not applied with voltage control under PQ designation, and formulas (12), (14) and formulas (15), (16) are used for a bus such as a generator bus applied with voltage control under PV designation. The extent of the voltage upon PV designation is usually made constant. However, in a case of considering the restriction of the reactive power or the operation of the voltage control equipment, the extent is changed in accordance therewith.

Further, the geometrical parameters α and γ are used and the formula (19) is used as the restriction formula as shown in "Bonini Neto A. et al., "Technique for Continuation Power Flow Using the Flat Start and for Ill-Conditioned Systems", World Journal Control Science and Engineering, Vol. 3, No. 1, pp. 1-7, 2015". The formula is in the form of considering both of ordinate convergence calculation on a λ-V plane (α=0 in the formula (19) in the modifier calculation using a voltage vector as a variant) and abscissa convergence calculation near the node end on a λ-V plane (β=0 in the formula (19) in the modifier calculation using a load parameter λ as a variant) "Venkataramana Ajjarapu, "Computational Techniques for Voltage Stability Assessment and Control", Springer, pp. 49-116, 2006.

[Formula 19]

$$R(y,\lambda,\alpha,\beta)=\alpha(\lambda-{}^{0}\lambda)-\beta([y]-[{}^{0}y])=0 \quad (19)$$

In the formula (19), R(y, λ, α, γ) is a restriction formula of the geometrical parameterization technique for the continuation power flow calculation, (0)λ is a load parameter at an initial point 0, α and γ are geometrical parameter values showing angles, and [y] is represented by the formula (2), which may be a voltage V or a voltage phase angle θ at one or more specific nodes, a sum of a voltage V at all nodes, a value of a sum of a voltage V at one or more or all nodes divided by an initial value of a voltage V at one or more or all nodes or a number of objection nodes (expressed mathematically by n), 2 norm of a voltage at one or more nodes, 3 norm of a voltage at one or more nodes or an infinite norm at one or more nodes. [$^{(0)}y$] may be a value identical with [$^{(1)}y$] calculated from the initial power flow calculation result, or 0 at the original point (0, 0). The original point may be (0, [$^{(0)}y$]=[$^{(1)}y$]), or (0, 0).

When the conditions of the formula (20) are set, the formula (19) is arranged as formula (21). In the formula (21), when the formula not explained above is to be described, R(V, λ, α) is a restriction formula of the geometrical parameterization technique in the continuous power flow calculation under the condition of the formula (20), and $\Sigma^{(k)}V_i$ is a sum of voltage values at each of the node at the $k_{th}$ point. Formula (21) represents a gradient on the λ-$\Sigma V_i$ plane. By considering the formula, the geometrical parameterization technique in the continuation power flow calculation can vary the conditions where the Yakobian matrix becomes singular.

[Formula 20]

$$[y]=\Sigma y_i, y=V_i\beta 0 \quad (20)$$

[Formula 21]

$$R(V,\lambda,\alpha)=\alpha(\lambda-{}^{0}\lambda)-(\Sigma V_i-\Sigma^{0}V_i)=0 \quad (21)$$

In the modifier calculation, a λ-$\Sigma V_i$ curve is prepared by changing the load parameter λ of the simultaneous equations of the formula (10) and the formula (19) (formula (21) in this embodiment) thereby solving the Newton-Raphson method or the like on each time while changing the effective power and the reactive power. A modified equation of the formula (22) can be obtained by previously setting the geometrical parameter values using a Tailer series expansion system of a multi-variable function to the formulas (10), (20), till the primary approximation. The modification amount Δx and Δλ in the equation (22) are determined, the determined modification amount is applied to the equation (23) to update x and λ and the solution is updated till the mismatch decreases to a certain threshold value or less thereby determining the modification point. This is a method of solving by the Newton-Raphson method.

[Formula 22]

$$\begin{bmatrix}\Delta G\\ \Delta R\end{bmatrix}=-\begin{bmatrix}J & G_\lambda\\ \partial R/\partial x & \alpha\end{bmatrix}\begin{bmatrix}\Delta x\\ \Delta\lambda\end{bmatrix}=-J_{Aug}\begin{bmatrix}\Delta x\\ \Delta\lambda\end{bmatrix} \quad (22)$$

[Formula 23]

$$\begin{bmatrix}x^{(l+1)}\\ \lambda^{(l+1)}\end{bmatrix}=\begin{bmatrix}x^{(l)}\\ \lambda^{(l)}\end{bmatrix}+\begin{bmatrix}\Delta x\\ \Delta\lambda\end{bmatrix} \quad (23)$$

Here, in the formula (22), ΔG is a mismatch in the formula (10) which is identical with the mismatch represented by the formula (12), (13) or (14) and the formulas (14), (15), or (16), ΔR is a mismatch of the restriction formula of the geometrical parameterizing technique in the continuation power flow calculation represented by the formula (21), J is a Yacobian matrix, partially differentiating the formula (10) with an element x, $J_{Aug}$ is an extended Yacobian matrix formed by partially differentiating the formulas (10) and (21) with elements of x and λ, Δx and Δλ are modified amounts of voltage and load parameter, $G_\lambda$ is an extended part of the Yacobian matrix formed by partially differentiating the formula (10) with an element λ, ∂R/∂x is an extended part of the Yacobian matrix formed by partially differentiating the formula (21) with an element x, α is an extended part of the Yacobian matrix formed by partially differentiating the formula (21) with an element λ, $x^{(l+1)}$ and $\lambda^{(l+1)}$ are calculation values at the l+1 step of the convergence calculation, and $x^{(l)}$ and $\lambda^{(l)}$ are calculation values in the 1 step of the convergence calculation. The appendix (1) on the right shoulder represents the number of step of the convergence calculation, which is initialized upon convergence. For the initial values of x, a flat start value, etc. making the extent of all voltages to 1 and the voltage phase to zero are used. By thus extending the Yacobian matrix, the convergence can be improved also near the voltage stability limit.

Further, the Newton-raphson method may be calculated either on the polar coordination system or on the orthogonal coordination system. Further, LU decomposition or the like is used for solving the simultaneous equations by the Newton-Raphson method and it may be calculated after reducing the fill-in by the ordering. This provides an effect capable of reducing the calculation amount. In the convergence judging processing of the Newton-Raphson method, mismatches shown by the formulas (10), (21) are determined and it is judged to be converged in a case where the maximum extent of each of the mismatching is equal to or less than the predetermined convergement judging threshold value ε. While it is described that the maximum extent of each of mismatches is used for the convergence judging processing, a sum of the mismatches may also be used. The modification amount may be used instead of using mismatch or both of them may be used for the judgement of convergence.

Figure 10A:
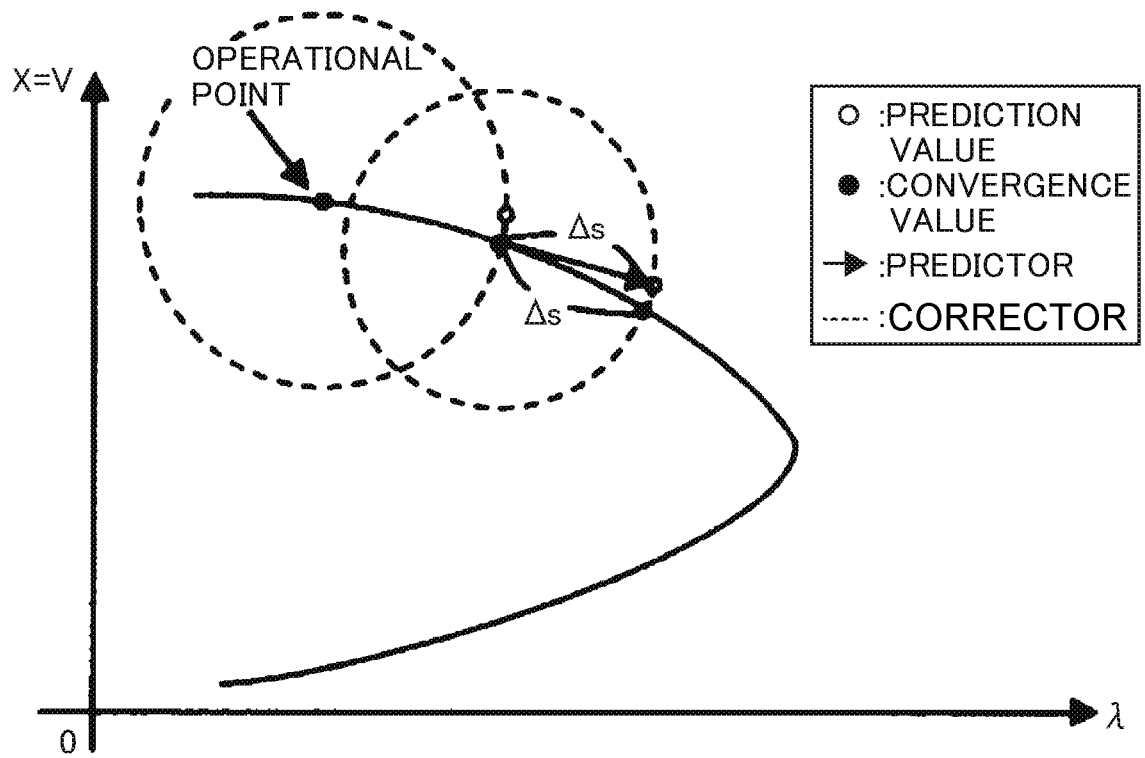
FIG. 10A is a diagram showing the concept of a CPF method where voltage vector and load parameter are regarded as a pseudo arc length.

In a case of using the continuation power flow calculation method (hereinafter abbreviated as CPF (:continuation power flow), the voltage vector and the load parameter are represented as variable determined by the pseudo arc length and determined by the formula (23) and the formula (24) as shown in "Chiang. H. D. et al., "CPFLOW: A Practical Tool for Tracing Power System Steady-State Stationary Behavior Due to Load and Generation Fluctuations", IEEE Trans. on Power Systems, Vol. 10, No. 2, pp. 623-634, 1995". FIG. 10a is a view illustrating the concept of the CPF method using the voltage vector and the load parameter as pseudo arc length in the literature. However, in FIG. 10a, the formula (24) and the formula (25), x is a voltage vector, λ is a load parameter, and s is a pseudo arc length.

[Formula 24]

$$x = x(s) \quad (24)$$

[Formula 25]

$$\lambda = \lambda(s) \quad (25)$$

It is assumed here that the following conditions of the formula (26) are given to the formula (24) and the formula (25), which are used instead of the formula (19). However, x is a voltage vector, n is a number of nodes, i is a number of variables, k is a number of steps, Δs is a fluctuation amount of a pseudo arc length.

[Formula 26]

$$\sum_{i=1}^{n} \left\{ \left( {}^{(k+1)}x_i - {}^{(k)}x_i \right)^2 \right\} + \left( {}^{(k+1)}\lambda_i - {}^{(k)}\lambda_i \right)^2 = \Delta s^2 \quad (26)$$

The formula (26) represents a hyper sphere, and the sum of the increments of the entire variables shows restriction partially equal with the values in linear approximation to the P-V curve. By the consideration for the formula, the CPF method changes the condition where the Yacobian matrix becomes singular. The description is referred to again to the geometrical parameterization technique in the continuation power flow calculation.

At the processing step S35, it is judged whether the number of convergence points determined in the processing step S34 is converged to the point N or not in addition to the convergence points determined in the processing step S31, and if it is not yet converged, the flow returns to the processing step S33, while changing the number k of step, as k=K+1 in the processing step S36, thereby changing Δα. When it is converged to the point N, the flow goes to the processing step S41. N=3 point in FIG. 5a.

In the processing step S41, the voltage stability limit prediction calculation is executed by using the system facility data D2 and the calculation setting data D3 stored in the processing step S1 as well as the state estimation result determined in the processing step S2, and the results are stored in the calculation result database DB4. Values λ at the node end of the λ-ΣV$_i$ curve, ΣV$_i$, etc. are calculated by the voltage stability limit prediction calculation and stored.

The method of voltage stability limit prediction calculation is executed by using a look-ahead method described in "Chiang. H. D. et al., "Look-Ahead Voltage and Load Margin Contingency Selection Functions for Large-Scale Power Systems", IEEE Trans. on Power Systems, Vol. 12, No. 1, pp. 173-180, 1997" (hereinafter referred to as L-A method, or a static voltage stability index calculation method using a current operational point and a voltage point for lower solution corresponding thereto (power flow multiple point solution) by Yokoyama Akihiko, Kumano Teruhisa, Sekine Taiji: "Static Voltage Stability Index Utilizing the Power Flow Multiple Solution", Electrical Engineer of Japan (Electric Power & Energy Section Journal), vol. 110, No. 11, pp. 870-879, 1990". The method of using the L-A method is to be described.

Here, in the λ-ΣV$_i$ plane in FIG. 5a, FIG. 5b, and FIG. 6, description is to be made for the voltage stability limit prediction calculation by the L-A method in a case of using the coordinate at the point N1 (${}^{(1)}\lambda$, ${}^{(1)}\Sigma V_i$) as the initial power flow calculation result, the coordinate at the 2nd convergence point N2 (${}^{(2)}\lambda$, ${}^{(2)}\Sigma V_i$) and the coordinate at the 3rd convergence point N3 (${}^{(3)}\lambda$, ${}^{(3)}\Sigma V_i$).

The λ-ΣV$_i$ curve passing the three points N1, N2, and N3 can be approximated by the following formula (27).

[Formula 27]

$$\lambda = a + b(\Sigma V_i) + c(\Sigma V_i)^2 \quad (27)$$

Here, the following formula (28), the formula (29) and the formula (30) are obtained by using the coordinate at the point N1 (${}^{(1)}\lambda$, ${}^{(1)}\Sigma V_i$), the coordinate at the point N2 (${}^{(2)}\lambda$, ${}^{(2)}\Sigma V_i$) and the coordinate at the third convergence point N3 (${}^{(3)}\lambda$, ${}^{(3)}\Sigma V_i$).

[Formula 28]

$${}^{(1)}\lambda = a + b(\Sigma^{(1)} V_i) + c(\Sigma^{(1)} V_i)^2 \quad (28)$$

[Formula 29]

$${}^{(2)}\lambda = a + b(\Sigma^{(2)} V_i) + c(\Sigma^{(2)} V_i)^2 \quad (29)$$

[Formula 30]

$${}^{(3)}\lambda = a + b(\Sigma^{(3)} V_i) + c(\Sigma^{(3)} V_i)^2 \quad (30)$$

Accordingly, coefficients a, b, and c can be determined in view of the formula (28), the formula (29), and the formula (30).

Further, the formula (27) described above is modified to obtain the following formula (31).

[Formula 31]

$$\lambda = c\left( \sum V_i + \frac{b}{2c} \right)^2 + a - \frac{b^2}{4c^2} \quad (31)$$

Further, the voltage stability limit $\lambda_{KMLP}$ in the maximum load point M ($\Sigma^{(1)} V_i = -b/2c$) as the voltage stability limit in FIG. 5a, FIG. 5b, and FIG. 6 is obtained according to the formula (32).

[Formula 32]

$$\lambda_{MLPtemp} = {}^{(0)}\lambda + \Delta\lambda_{MLPtemp} = {}^{(0)}\lambda + \frac{\sum {}^{(0)}V_i^+ - \sum {}^{(0)}V_i^-}{2\left( \frac{d\sum {}^{(0)}V_i^-}{d\lambda} - \frac{d\sum {}^{(0)}V_i^+}{d\lambda} \right)} \quad (32)$$

In the case of the voltage stability limit prediction calculation by the L-A method using only the coordinate at the point N1 (${}^{(1)}\lambda$, ${}^{(1)}\Sigma V_i$) as the result of the initial lower flow on the λ-ΣV$_i$ plane and the coordinate at the 2nd point N2 (${}^{(2)}\lambda$: ${}^{(2)}\Sigma V_i$), the following equation (33) is obtained instead of the formula (28), the formula (29) and the formula (30) for the coordinate and the coefficients a, b, c can be determined by using the differentiation value $\Sigma^2 V_i$ dot at the point N1 ($^{(1)}\lambda$, $\Sigma^{(1)}V_i$) and the coordinate at the 2nd point N2 ($^{(2)}\lambda$, $\Sigma^{(2)}V_i$). Other calculations are identical with those described above.

[Formula 33]

$$\lambda_{MLPtemp} = a - \frac{b^2}{4c^2} \tag{33}$$

Figure 11:
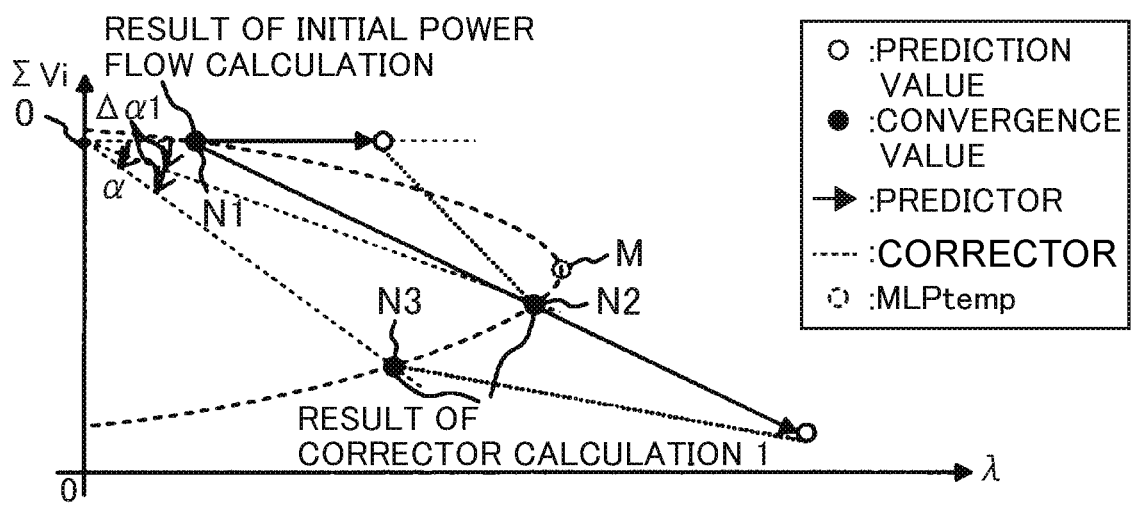
FIG. 11 is a diagram showing the result of voltage stability limit prediction calculation in a case where $\Delta\alpha 1$ is large.

FIG. 5a shows an image for determining MLPtemp by using the L-A method. The value for the geometrical parameter $^{(k)}\alpha$ is sufficiently small and calculation is executed while increasing the value each by $\Delta\alpha 1$. FIG. 11 shows a case where the operational point and MLP are close each other or the $\Delta\alpha 1$ is large. It can be seen also in this case where the voltage stability limit prediction calculation can be executed by the L-A method with no problem.

Here, use of the calculation method of the static voltage stability index instead of the L-A method in the processing step S41 is also to be explained. FIG. 5c illustrates an image of determining MLPtemp by using the calculation method of the static voltage stability index. Here, N1$^+$ is an initial power flow calculation result, which is a higher voltage operational point at (0)$\lambda$, and N1$^-$ is a lower voltage operational point at (0)$\lambda$ described in "Static voltage stability index utilizing power flow multiple route solution" in the Institute of Electrical Engineers of Japan B (Electric Power and Energy Department Journal), Vol, 110, No. 11, pp. 870-879, 1990. N1$^-$ is determined by the method described in the literature shown above, "CPFLOW using house holder conversion method" by Keisuke Mori, Sohei Yamada in P-01-128, PSE-01-122, 2001" the Institute of Electrical Engineers of Japan Power System Technical Joint Meeting.

When the calculation method of the static voltage stability index is used for N1$^+$ and N1$^-$, $\lambda_{MLPtemp}$ can be determined by the formula (34). Here, $\Sigma^{(0)}V_i^*$ is a sum of the extent of voltages at the convergence point N1$^+$ in the initial power flow calculation, $\Sigma^{(0)}V_i^-$ is a sum of the extent of the voltages at the lower voltage operational point for N1$^-$ determined in pair with N1$^+$, $d\Sigma^{(0)}V_i^+/d\lambda$ is a sensitivity of the sum of the extent of voltages to $\lambda$ at the convergence point N1$^+$ of the initial power flow calculation, $d\Sigma^{(0)}V_i^-/d\lambda$ is a sensitivity for the sum of the extent of voltages to $\lambda$ at the lower voltages operation point of Ni$^-$.

[Formula 34]

$$1 = b(\Sigma^{(2)}\dot{V}_i) + 2c(\Sigma^{(2)}\dot{V}_i)(\Sigma^{(2)}V_i) \tag{34}$$

It can thus be seen that the voltage stability limit prediction can be calculated not by the L-A method but also by the calculation method for the static voltage stability index.

In the processing step S42, $^{(k)}\alpha$ in determination of the N+1 the point (4th point in FIG. 5b) is determined by the following formula (35). $\beta$ in the formula (35) is a geometrical parameter value formed at the point 0 to the voltage stability limit prediction point and rate is a rate parameter that represents the rate of $\alpha$ to be calculated before the point. For example, rate=0.9.

[Formula 35]

$$^{(k)}\alpha = \beta \times rate \tag{35}$$

$\beta$ is determined by the following formula (36) and shown as in FIG. 5b.

[Formula 36]

$$\beta = \frac{(\sum V_{i_{MLPtemp}} - \sum {}^{(0)}V_i)}{(\lambda_{MLPtemp})} \tag{36}$$

Here, the determination method for $^{(k)}\alpha$ in the processing step 42 is additionally provided in the case of using not the geometrical parameterization technique in the continuation power flow calculation but using the continuation power flow calculation. $^{(k)}\alpha$ upon determination of the N+1 point (4th point in FIG. 5b) is determined by the following equation (37). Here, $\Delta s_{MLPatemp}$ in FIG. 10 in the formula (37) is a distance from the voltage stability limit prediction point to the convergence point immediately before on the hyper plane which is a geometrical parameter value of a circle having the distance to the convergence point, i.e., a center as a radius, $^{(k)}\Delta s$ is a geometrical parameter value obtained by multiplying the rate to $\Delta S_{MLPtemp}$, and the rate is a rate parameter that represents percentage of the rate of $\Delta s$ to be calculated before the point. For example, the rate=0.9.

[Formula 37]

$$^{(k)}\lambda < {}^{(k-1)}\lambda \tag{37}$$

Figure 10B:
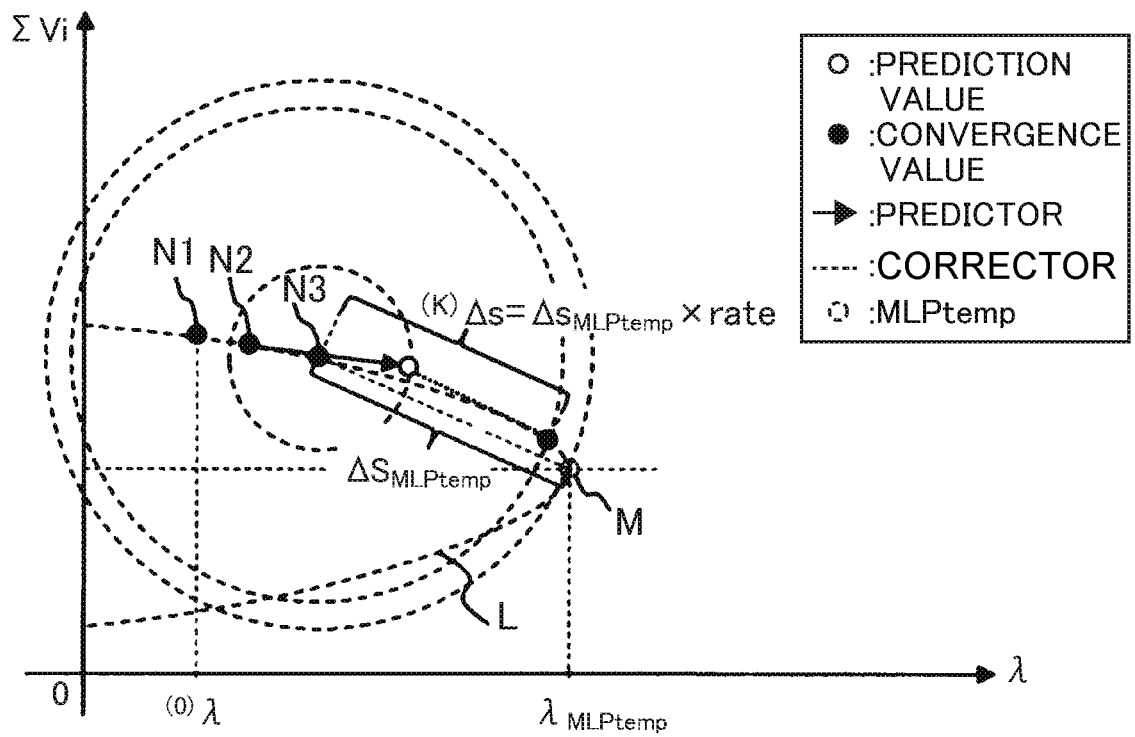
FIG. 10B is a diagram showing a $\lambda$-$\Sigma V_i$ curve for explaining the concept of determining the voltage stability.

Square of $\Delta S_{MLPtemp}$ is determined by the following equation (38) and shown as in FIG. 10b. Since the number of calculations for convergence point can be decreased, the calculation amount can be reduced.

[Formula 38]

$$^{(k+1)}\alpha = {}^{(k)}\alpha - \Delta\alpha 2 \tag{38}$$

Thus, according to the present invention, the number of calculations for the convergence point can be decreased without restricting the method of the modifier calculation.

At the processing step S51, modifier calculation like in the processing step S34 is executed by using $^{(k)}\alpha$ calculated in the processing step S42.

In a the processing step S52, it is judged whether the voltage stability limit (MLP) has been found or not by using the following formula (39).

[Formula 39]

$$\Delta\lambda_{MLP} = (\lambda_{MLP} - {}^{(0)}\lambda)/{}^{(0)}\lambda \tag{39}$$

If the formula (39) is not established, it is judged that the voltage stability limit (MLP) has not yet been found and the flow goes to the processing step S54 with the step number k being increased as k=k+1 in the processing step S53. If the formula (36) is established, it is judged that the voltage stability limit (MLP) has been found and the flow goes to the processing step S6.

In the processing step S54, $^{(k+1)}\alpha$ is determined by the formula (6) in the same manner as in the processing step S33. However, $\Delta\alpha 2$ is used instead of $\Delta\alpha 1$. $\Delta\alpha 1$ and $\Delta\alpha 2$ may be identical but, for more simply determining the maximum load point M, it is set such that the value can be set larger or smaller previously. The formula (40) represents a formula using $\Delta\alpha 2$ instead of $\Delta\alpha 1$ in the formula (6).

[Formula 40]

$$\Delta P_{MLP} = (P_{MLP} - {}^{(0)}P)/{}^{(0)}P \tag{40}$$

In a case of calculating the voltage stability curve by a geometrical parameterization technique for the continuation power flow calculation by using the result of voltage stability calculation condition determination, if the voltage stability limit is not determined, the geometrical parameterization technique for the continuation power flow calculation is preferably continued by changing the notched value in the predictor calculation or reversely changing the sign of the geometrical parameter for the corrector calculation.

FIG. 6 shows an example of repeating the processing step 51 to the processing step S54. On the other hand, FIG. 8 shows the result of repeating the processing step S31, the processing step S32, and the processing step S33 instead of the processing step S35 under the calculation completion condition of the processing step S52.

Figure 8:
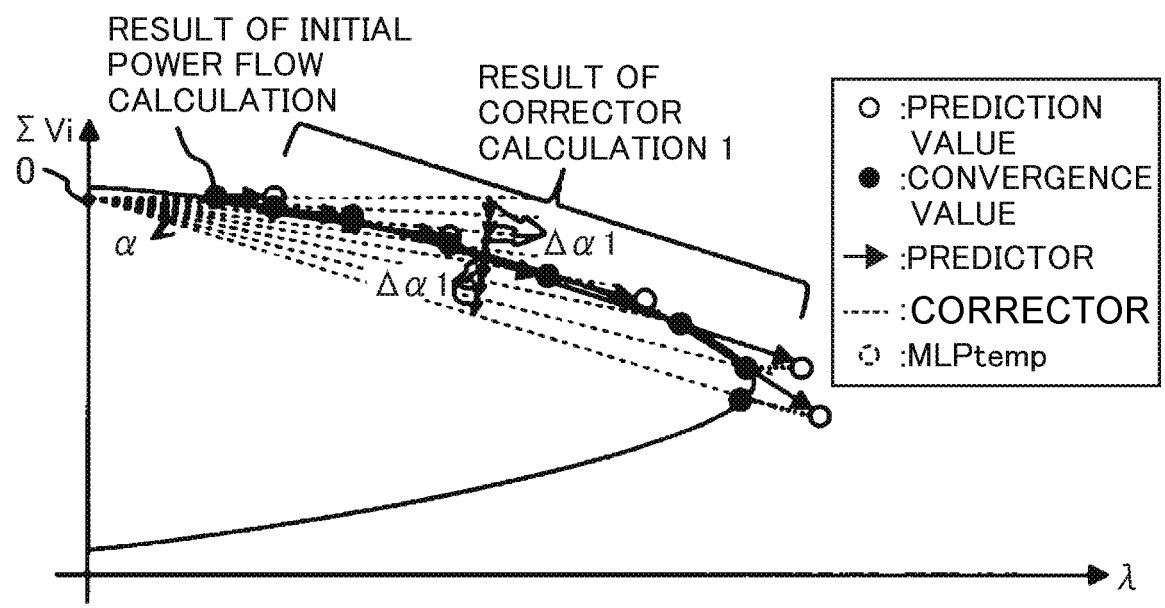
FIG. 8 is a diagram illustrating an example of partially modifying the processing in FIG. 6 under condition.

When FIG. 6 and FIG. 8 are compared, the convergence point is fixed to the maximum load point M at the top end to provide an effect capable of improving the accuracy in FIG. 6 adopting the proposed technique. Depending on the shape and the size of the λ-$\Sigma V_i$ curve, application of the proposed method can provide an effect of decreasing the number of conversion points, thereby capable of suppressing increase in the calculation amount.

Figure 12:
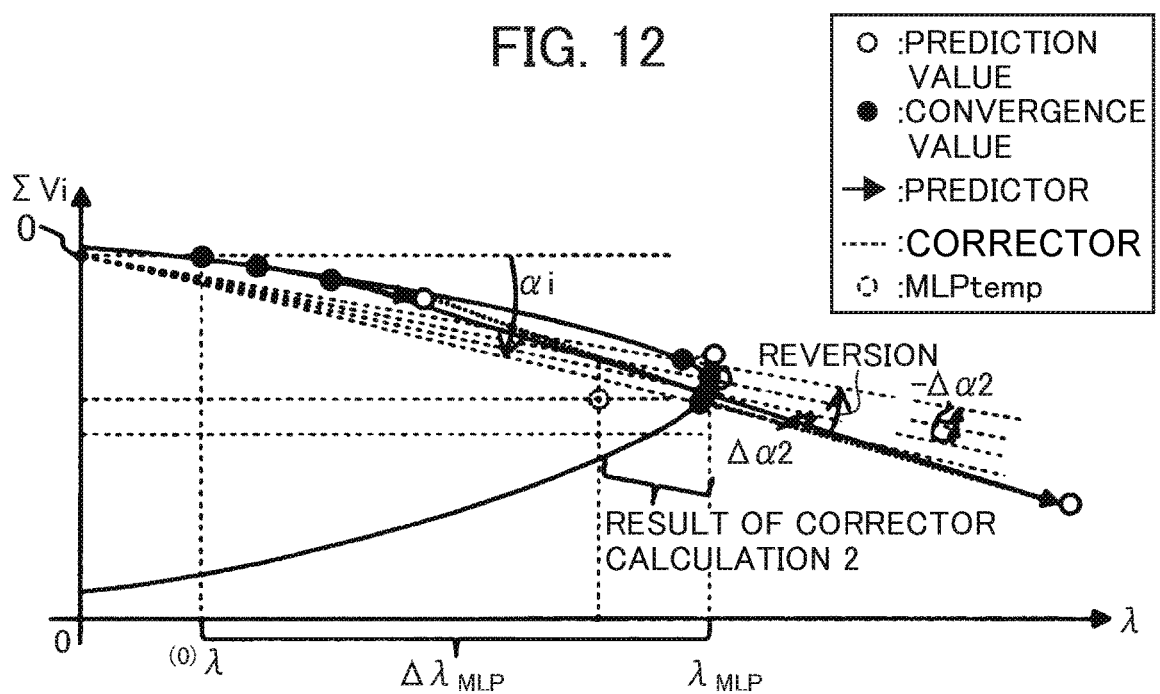
FIG. 12 is a diagram showing processing upon $\Sigma V_i$ voltage stability limit prediction value <voltage stability limit.

Further, an exceptional processing of the processing step S54 may be provided preferably. Unlike FIG. 6, when the voltage stability limit $\Sigma V_i$ is higher than the voltage stability limit prediction value as shown in FIG. 12, this is judged in the step S52 to provide an effect capable of improving the search accuracy for the voltage stability limit (MLP) as shown in FIG. 12 by judging the sign of Δα2 in the step S54. FIG. 12 represents that the sign of Δα2 is reversed upon reversion of the Δα2.

Referring again to FIG. 3, in the processing step S7, the voltage stability margin is calculated and the result of the voltage stability margin calculation is stored in the calculation result database DB4.

The processing content in the processing step S7 corresponds to the processing in the voltage stability margin calculation unit. When there are increasing conditions of assumed load or power flow and one or more buses and locations as one or more monitoring targets, one or more of severe fluctuation of conditions, the cases, the buses or locations as a monitoring targets, voltage stability and voltage stability margin thereof are calculated in a constant or variable monitoring period. Further, the voltage stability margin calculated in the voltage stability margin calculation unit is a deviation from the operational point to the limit point obtained by using the curve calculated in the result of the voltage stability curve calculation.

$\Delta\lambda_{MLP}=(\lambda_{MLP}-{}^{(0)}\lambda)$ calculated from the λ-$\Sigma V_i$ curve L shown in FIG. 6, $\Delta\lambda_{MLP}=(\lambda_{MLP}-{}^{(0)}\lambda)/{}^{(0)}\lambda$ of the formula (41), $\Delta P_{MLP}=(P_{MLP}-{}^{(0)}P)$ calculated from the P-V curve, $\Delta P_{MLP}=(P_{MLP}-(0)P)/{}^{(0)}P$ of the formula (42), $\Delta\Sigma V_{MLP}$, etc. may be voltage stability margin. Here, $\lambda_{MLP}$ is a load factor at a voltage stability limit MLP (maximum load point M), ${}^{(0)}\lambda$ is a load factor for the result of initial power flow calculation, $P_{MLP}$ is a load effective power P sum ΣP of the effective load power ΣP at the voltage stability limit, ${}^{(0)}P$ is an effective load power and the sum ΣP of the effective load power as a result of the initial power flow calculation, and $\Delta\lambda_{MLP}$, $\Delta P_{MLP}$ or $\Delta\Sigma P_{MLP}$ is a voltage stability margin.

[Formula 41]

$$\Delta^{(k)}Qg_i=Qg_{imax}-{}^{(k)}Qg_i \qquad (41)$$

[Formula 42]

$${}^{(k)}\alpha'=\beta\times rate\times C \qquad (42)$$

Figure 7:
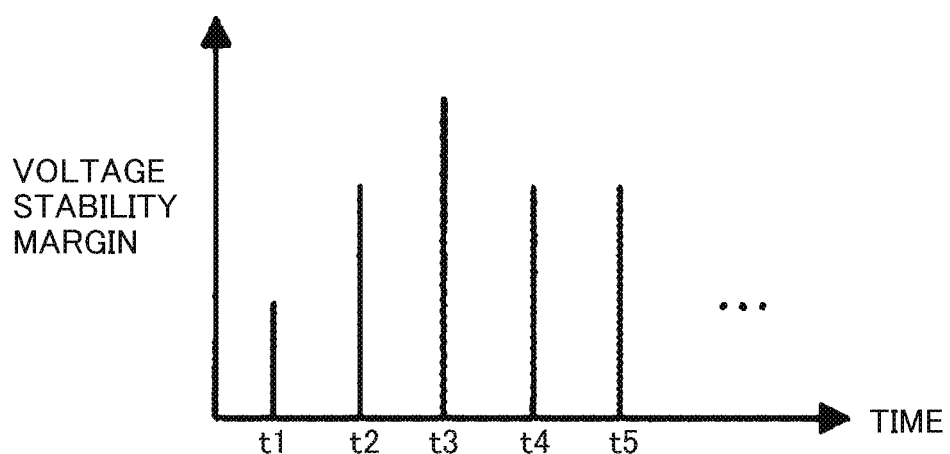
FIG. 7 is a diagram showing a result of voltage stability margin calculation.

Here, FIG. 7 shows a time series waveform of the voltage stability margin. By indicating a change with time of such voltage stability margin on a display screen or the like, this provides an effect of definitely showing an operator a time slot in which the voltage stability is decreased.

Further, when the finally determined voltage stability margin is outputted externally, it may be considered to evaluate and output for each of failure cases (combination of failure location+mode) when the fluctuations in the rechargeable energy is taken into consideration. For example, it may be considered trunk the fluctuation of the rechargeable energy at a certain failure case, or rank the fluctuation by an average value. This provides an effect capable of simply showing what failure case tends to result voltage instability, which facilitates to take easy countermeasure. When the result of the ranking is different depending on the type of the severe threshold value, definition of the voltage stability margin given by evaluation is different (ΔV, ΔP, etc.).

FIG. 9 is a chart showing a modified embodiment of FIG. 4. In FIG. 9, the processing in the step shown by symbol "'" is different from that in FIG. 4. Specifically, in the calculation flow shown in FIG. 9, a large Δα1 is taken at the step S33 in the calculation flow shown in FIG. 9, a modifier calculation 1 of a predictor with a large notch is executed in the processing step S34' without using the L-A method (only rough calculation of geometrical parametrization technique for the continuation power flow calculation), and after prediction determination of MLPtemp in the step S35' and step S41', calculation in the step 42 is executed. Subsequently, in the processing step S51', voltage stability limit is calculated by modifier calculation 2 (calculation by the geographic parameterization technique for the continuation power flow calculation of Δα2).

Figure 19A:
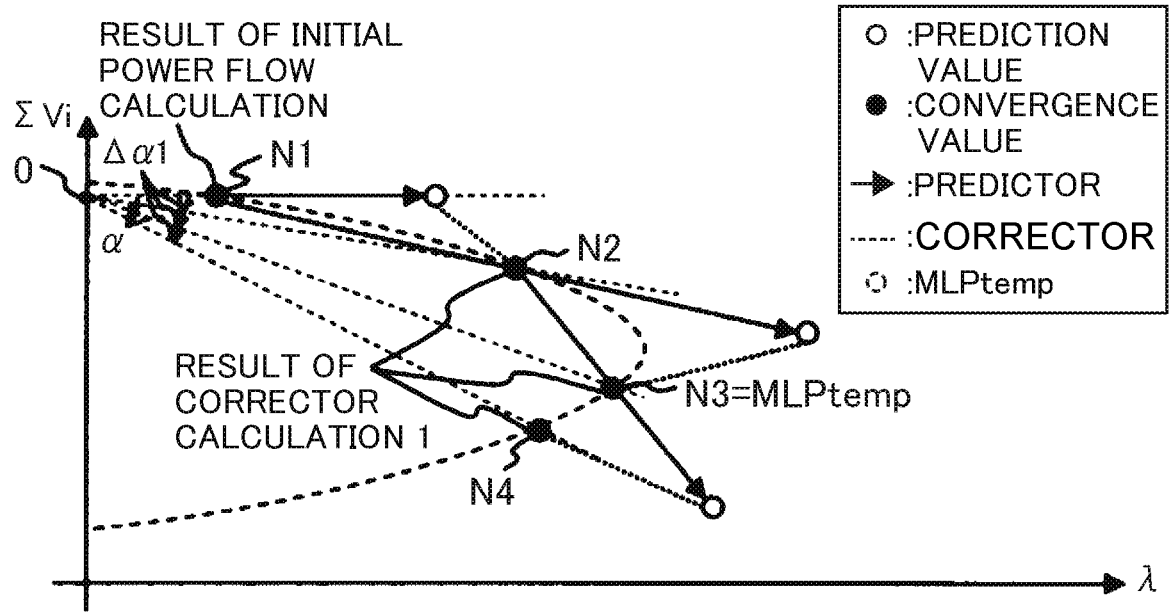
FIG. 19A is a diagram for explaining the processing in FIG. 9.
Figure 19B:
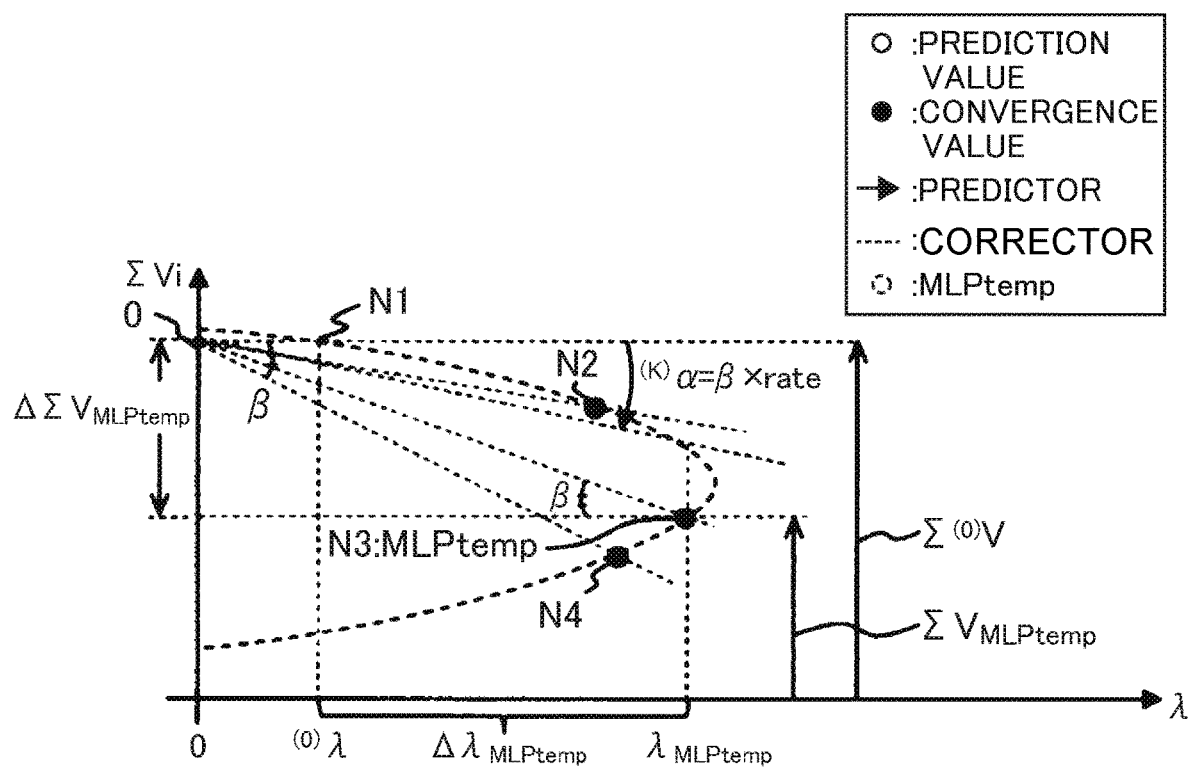
FIG. 19B is a diagram for explaining the processing in FIG. 9.

FIG. 19a and FIG. 19b are diagrams for explaining the processing by FIG. 9. In FIG. 9, MLPtemp is at the N3 point as the result of calculation for k-1 in a case where the step S35' is YES as shown in FIG. 19a. Further, ${}^{(k)}\alpha$ can be determined as shown in FIG. 19b. Thus, calculation can be executed while using algorithms which are identical as much as possible.

Any one of the methods in the first embodiment described above may be used for the ranking method such as for assumed fault assumption. This provides an effect capable of increasing the ranking speed.

Further, the voltage stability margin may be calculated first only by the L-A method and subsequently applying the method of the first embodiment while restricting, for example, to a severe case with less margin or a case where the margin cannot be determined. This can provide an effect capable of increasing the speed of ranking and improving the accuracy of calculating the voltage stability margin to the severe case.

The processing in FIG. 4 according to the present invention described above include, in summary, "determining an initial power flow point on a coordinate indicating a voltage stability curve by an initial power flow calculation, setting a position of the initial power flow point as a reference point on the voltage axis or the electric power axis of the coordinate, determining a straight line at a gradient α passing through the reference point as a geometrical parameter value, determining a plurality of power flow points on the voltage stability curve by using a plurality of straight lines each at a gradient, determining the voltage stability curve in view of the plurality of power flow points, and determining the margin value of the voltage stability based on the voltage and the electric power at the peak point of the voltage stability curve and the voltage and the electric power at the current point. Further, in this case, a plurality of straight lines each with a gradient α described above are set to the vicinity of the peak point of the voltage stability curve, thereby determining the peak point again.

In the explanation described above, the voltage stability limit prediction unit 31 calculates the voltage stability limit by any one of the repetitive power flow calculation method, the repetitive optimal power flow calculation method, continuation power flow calculation method (continuation method), geometrical parameterization technique for the power flow calculation, and approximation methods based on the result of calculation in the optimal power flow calculation method, the repetitive power flow calculation method or repetitive optimal power flow calculation method, the continuation power flow calculation method, as well as the direct calculation.

Among them, the continuation power flow calculation method is a method referred to in the mathematic field as continuation method and "CPF: CPFLOW continuation power flow method" is general in the voltage stability curve calculation.

The geometrical parameter in "continuation geometrical parameterization technique for the continuous power flow calculation" means an angle α including the load factor λ on the abscissa and the sum of the voltages $\Sigma V_i$ at the node i on the ordinate. Further, "geometrical parameterization technique for the continuation power flow calculation" is literal translation of PCPF: geometrical parametrization technique for continuation power flow.

The approximate calculation method in "the approximate calculation method based on the result of the calculation of the geometrical parameterization technique for the power flow calculation method, the optimal power flow calculation method, the repetitive power flow calculation method, the repetitive optimal power flow calculation, the continuation power flow calculation method" is a method of calculating the anticipating (look-ahead method) described in "Chiang. H. D. et al., "Look-Ahead Voltage and Load Margin Contingency Selection Functions for Large-Scale Power Systems", IEEE Trans. on Power Systems, Vol. 12, No. 1, pp. 173-180, 1997" (hereinafter referred to as L-A method, or a static voltage stability index calculation method using a current operational point and a voltage point for lower solution corresponding thereto (power flow multiple point solution) by Yokoyama Akihiko, Kumano Teruhisa, Sekine Taiji: "Static Voltage Stability Index Utilizing the Power Flow Multiple Solution", Electrical Engineer of Japan (Electric Power & Energy Section Journal), vol. 110, No. 11, pp. 870-879, 1990" by using calculation result of the geometrical parameterization method in the power flow calculation method, the optimal power flow calculation method, repetitive calculation method, optimal repetitive calculation method, continuous powder flow calculation method and optimal continuous power flow calculation method.

"Direct calculation method" is a direct calculation method for branching point & maximum load point described in "continuation power flow calculation method based on sequential calculation of restricted switching point" by Yorino, et. al. in the Institute of Electrical Engineers of Japan B, Vol. 119, No. 2, 1999" which is a method of determining a saddle node branch or immediate instable point as a voltage stability limit by using a PoC (point of collapse) method or an immediate instable point method.

Second Embodiment

For a second embodiment, it is explained to a case of considering various restrictions upon executing a voltage stability limit prediction calculation processing step S3, a voltage stability calculation condition determination processing step S4, and a voltage stability curve calculation processing step S5 in the processing flows shown in FIG. 3 and FIG. 4 of the first embodiment. In this case, various restrictions include one or plural restrictions, for example, reactive power output of generators, voltage characteristic restrictions of loads and effective power restrictions of associated lines. In the explanation of the second embodiment, it is to be explained to an example in which only one of the reactive power restrictions of the generators is present as the restriction condition.

Figure 15:
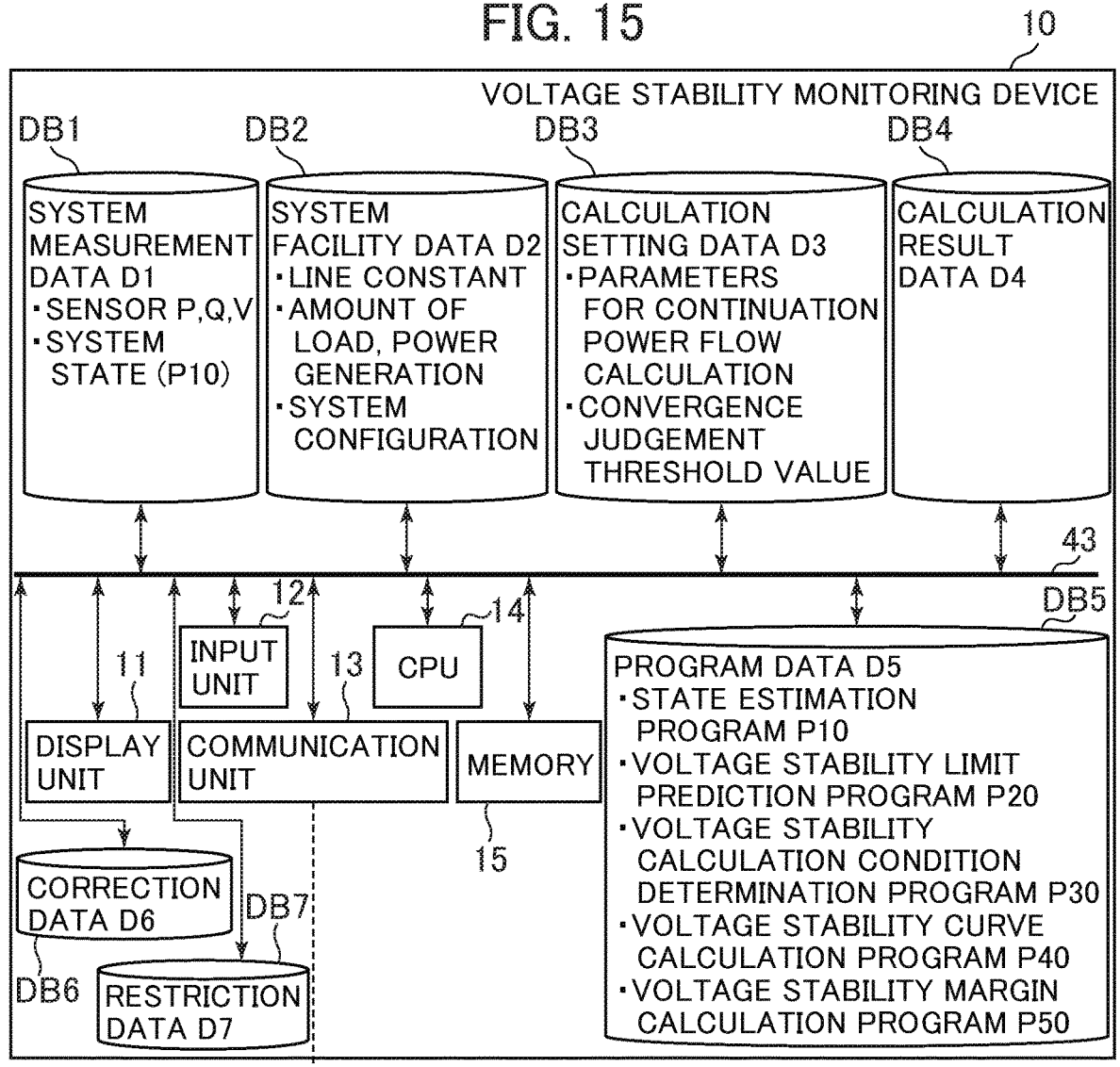
FIG. 15 is a view showing a hard configuration of a voltage stability monitoring device and an entire configurational view of a power system in a second embodiment.

FIG. 15 is a view illustrating a hardware configuration of a voltage stability monitoring device and an entire configuration example of a power system in the second embodiment, which corresponds to FIG. 2 of the present the first embodiment. FIG. 15 is different from FIG. 2 in that a correction database DB6 for storing the correction data D6 and a restriction database DB7 for storing restriction data D7 are provided additionally to the voltage stability monitoring device 10 in FIG. 2. The contents of the program data D5 in the program database DB5 are partially changed, but no particular description is made because this is made apparent by the following description.

Figure 16:
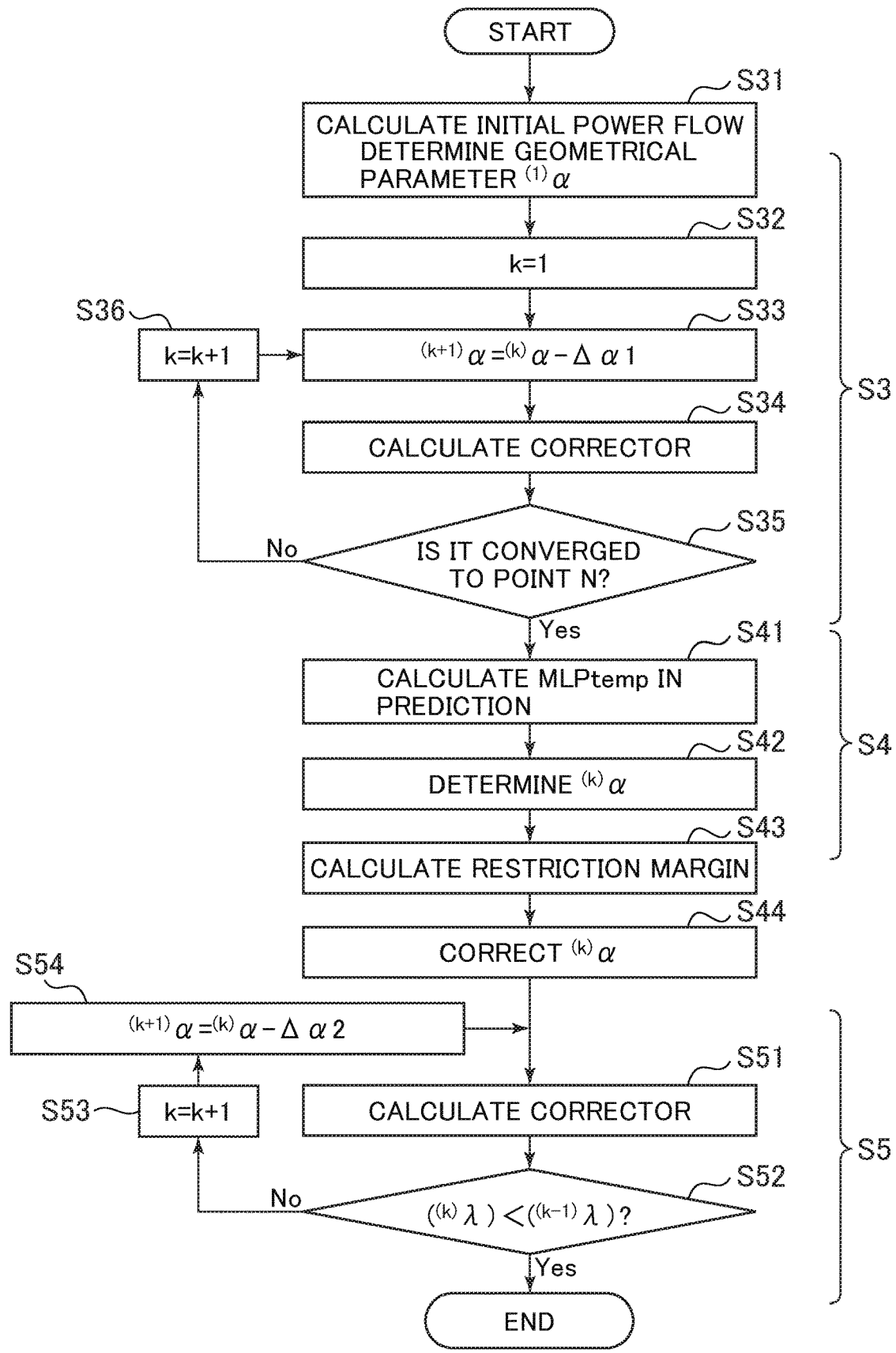
FIG. 16 is a flow chart showing processing from voltage stability limit prediction to voltage stability curve calculation in the second embodiment.

FIG. 16 is a flow chart illustrating the processing from the voltage stability limit prediction to the voltage stability curve calculation in the second embodiment which corresponds to FIG. 4 of the first embodiment. FIG. 16 is different from FIG. 4 in that a processing step S43 and a processing step S44 are additionally provided to the flow chart in FIG. 4.

Before describing the additional processing step S43 and processing step S44 specifically, the outline for the restriction conditions considered in the second embodiment and the reason to be taken as the countermeasure therefor are to be explained with reference FIG. 17*a*, FIG. 17*b* and FIG. 17*c*.

Figure 17A:
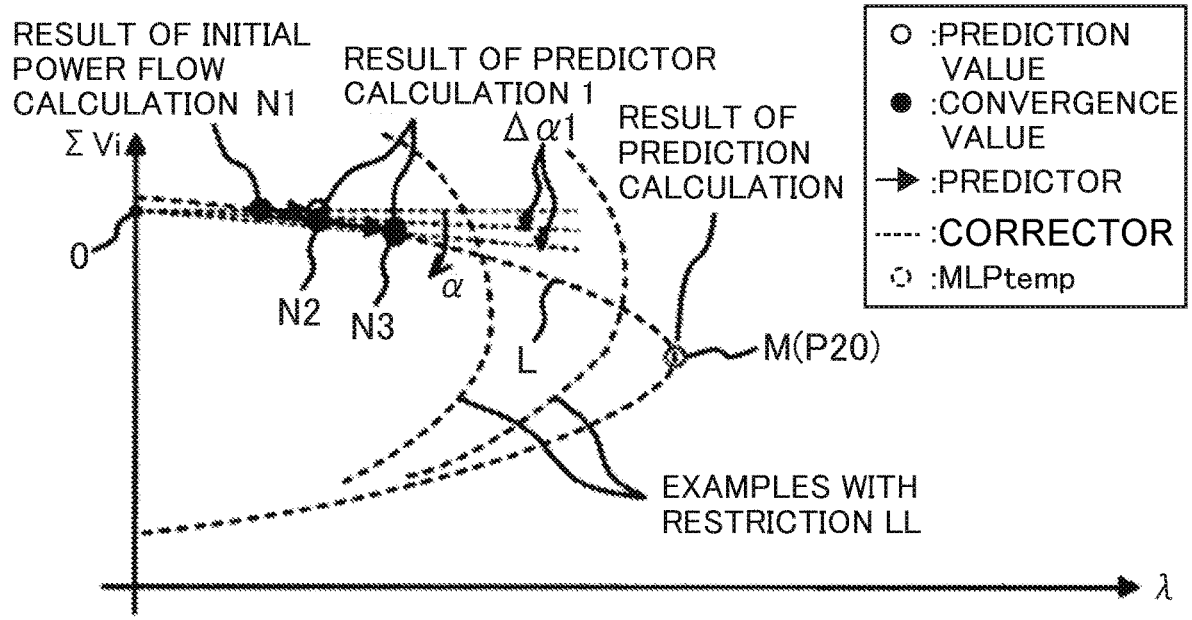
FIG. 17A is a diagram for explaining the processing when restriction conditions are present in the $\lambda\text{-}\Sigma V_i$ curve.

FIG. 17*a* is a diagram illustrating a $\lambda$-$\Sigma V_i$ corresponding to FIG. 5*a*. FIG. 5*a* shows that a voltage stability curve is drawn as illustrated by L in a case where there is no restriction. On the contrary, FIG. 17*a* shows a case where a plurality of various restrictions LL are present.

Figure 17B:
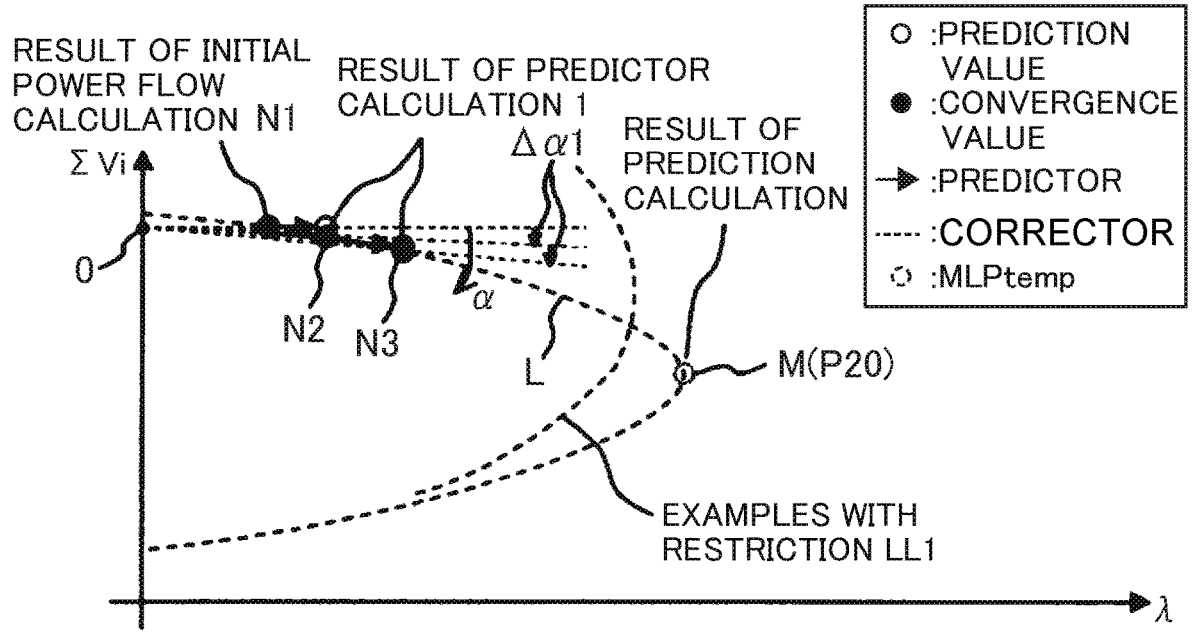
FIG. 17B is a view for explaining the processing when constrained conditions are present in the $\lambda\text{-}\Sigma V_i$ curve.
Figure 17C:
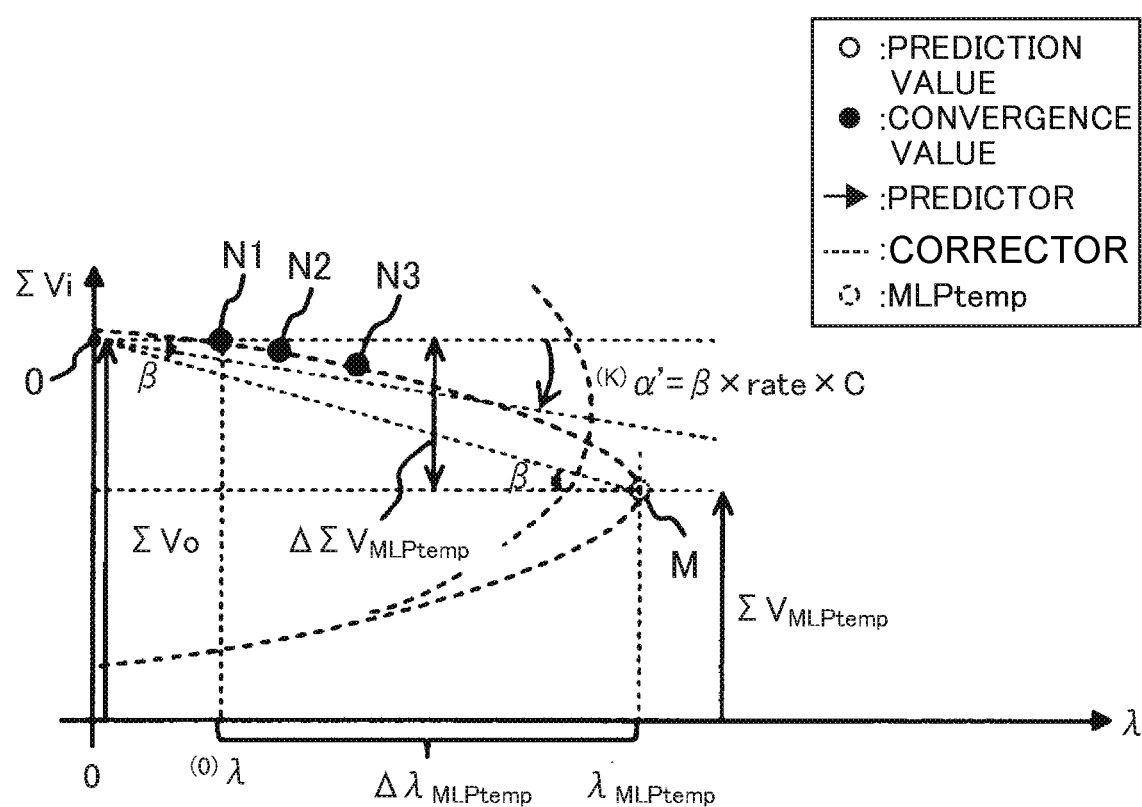
FIG. 17C is a diagram for explaining the processing when restriction conditions are present in the $\lambda\text{-}\Sigma V_i$ curve.

Among assumed restrictions, FIG. 17*b* shows a relation between a voltage stability curve L and a reactive power output restriction LL1 of a generator in a case where a reactive power output restriction LL1 of the generator is present. In "Continuation power flow calculation method based on sequential calculation for restriction switching points": Yorino, et. al., the Institute of Electrical Engineers of Japan B, Vol. 119, No. 2, 1999", and "Voltage stability limit in electric power system considering the power output restriction of a generator": Kataoka, et. al., the Institute of Electrical Engineers of Japan B, Vol. 123, No. 6, 2003", a relation between the voltage stability curve L and a reactive electrical power output of a generator in described specifically. In the voltage stability calculation, if the reactive electrical power restriction of the generator is related, there is a high possibility that the maximum load point is estimated on this side compared to the case with no restriction as shown in FIG. 17*b*.

A countermeasure is taken for this in the processing step S43 and the processing step S44, by using the correction data D6 and the restriction data D7. Specifically, a calculation of the control margin is first executed for judging whether $^{(k)}\alpha$ correction determined in the processing step S42 is necessary or not in the processing step S43.

In the processing step S43, a control margin $\Delta Qgi$ till the reactive electric power output of each generator reaches a restriction value $Qg_{imax}$ is calculated according to the formula (43). The control margin related with the correction data D6 may be a maximum value among a plurality of generators $\Delta Qgi$ or may be set to each of a plurality of generators $\Delta Qgi$, or it may be a sum of a plurality of generators $\Delta Qgi$.

[Formula 43]

$$^{(n)}\lambda, \Sigma^{(n)}V_i) = [(^{(k-1)}\lambda + ^{(k)}\lambda)/2, (\Sigma^{(k-1)}V_i + \Sigma^{(k)}V_i)/2] \quad (43)$$

In the processing step S44, $^{(k)}\alpha$ is amended by using the correction data D6 in which a coefficient for amending $^{(k)}\alpha$ is previously stored while considering proximity between the control margin $\Delta Qgi$ and the MLP with restriction. Thus, if $^{(k)}\alpha$ exceeding MLP with restriction is determined in the step S42. $^{(k)}\alpha'$ cam be amended and determined according to the formula (44) by using the control margin $\Delta Qgi$ calculated as above and the amendment coefficient C selected in the amendment data D6.

[Formula 44]

$$^{(k)}\alpha = (\Sigma^{(n)}V_i - \Sigma^{(k)}V_i)/(^{(n)}\lambda - ^{(k)}\lambda) \quad (44)$$

In FIG. 16, the processing 1 after the processing step S51 is identical with those in the first embodiment. FIG. 17C illustrates a calculation image of the processing step S44. As apparent from comparison between $^{(k)}\alpha$ in FIG. 5b showing the state before amendment and $^{(k)}\alpha'$ in FIG. 17c showing the state after amendment, it can be seen that $^{(k)}\alpha$ is amended as $^{(k)}\alpha'$ and made smaller. This amendment enables calculation considering MLP restriction to provide an effect capable of improving the convergence and reducing the calculation time.

Further, although not shown in the drawing, in order to prepare for calculation impossible in a case with restriction, there may be provided a back-up computing function of calculating the voltage stability curve moderating restrictions to execute the voltage stability curve. While provision of the backup calculation function may lower the accuracy in the calculated result of the voltage stability margin, this can provide an effect to the operator capable of avoiding the situation that the calculation result is not available, the situation to be avoided among others. Further, a function of displaying that the accuracy is poor may be provided. This enables the operator to recognize that the accuracy is poor and perform judgements affording a margin.

Third Embodiment

For a third embodiment, description is to be made to an example of the voltage stability monitoring device that enables voltage stability monitoring according to the operator's needs by performing each of the calculations in parallel in the first embodiment and the second embodiment under a plurality of each of calculation conditions in the first embodiment and the second embodiment. While it may be considered a case of serial calculation without parallel calculation for each of a plurality of calculation conditions, an example of parallel calculation is shown here.

The respective the calculation conditions include one or a plurality of calculation parameters and calculation algorithms in the voltage stability limit prediction calculation processing step S3, the voltage stability calculation condition determination processing step S4, the voltage stability curve calculation processing step S5 and each of the of restrictions shown in the second embodiment.

Referring specifically, the calculation parameters include, for example, values of $(0)\sigma$ or $\Delta\alpha1$. The calculation algorithms include, for example, each of the voltage stability limit prediction calculation methods and each of the voltage stability curve calculation methods shown in the first embodiment.

Such calculations have advantages on one hand and drawbacks in the calculation execution. For example, when the L-A method is used, operation speed is high but accuracy is poor. In the repetitive power flow calculation, there is a case where the speed is high but the convergence is difficult. In the CPF method of the continuation power flow calculation, the convergence is high but the calculation speed is low. In the geometrical parameterization technique for the continuation power flow calculation, high speed and high convergence are attained at an optimal $\alpha$. In the OPF repetitive calculation, while the aimed function can be optimized considering a plurality of restrictions, the amount of calculation increases and the speed is lowered.

Further, various restrictions shown in the second embodiment include one or a plurality of restrictions such as reactive power output restriction of generators, voltage characteristic restriction of loads, and effective power restriction of interconnection links. Since the characteristics restrictions of load vary depending on the introduction amount and the output state of regeneratable energy, this provides an effect that the operator can evaluate in accordance with the introduction amount or the output state of the regeneratable energy by enabling setting with a margin.

Operators in charge of voltage stability monitoring jobs have different needs for calculation accuracy, high speed calculation, and convergence. Then, such needs can be coped with flexibly by performing the following processing.

When parallel calculations are executed under each of plurality of calculation conditions, the voltage stability curve, voltage stability margin, etc. as the result of calculation conditions that can be calculated at a high speed though at a poor accuracy can be displayed first. Then, every time the calculation result at good accuracy but at slow speed is obtained the voltage stability curve, the voltage stability margin, etc. are updated. In this case, when the calculation accuracy such as a voltage stability curve and a voltage stability margin at present are displayed together, there is an effect for the operator to be capable of easy consideration for taking the reliability and a margin therefor in evaluation of the current voltage stability.

Further, one or more of a time to be taken to complete the calculation, a time up to the next measuring period, or a time to the calculation completion at the beginning of the next measuring period may be displayed. This provides an effect of facilitating the operator's judgement whether to wait till the completion of a calculation condition in the next measuring period.

Further, one or more of each of a plurality of calculation conditions may be set selectably. This can improve the operator's customization.

Fourth Embodiment

In a fourth embodiment, a concept of the maximum load point search in a case where the voltage stability curve is a $\lambda$-Pa (effective power loss in the entire electric power system) curve is to be explained briefly. Facilities and procedures adopted in this case are basically identical with those explained for the other embodiments, and explanation is added because the characteristics shown in FIG. 13 have a maximum load point but the shape of curve is different from that of a λ-ΣV$_i$ curve or a λ-β (voltage phase angle) curve.

Figure 18A:
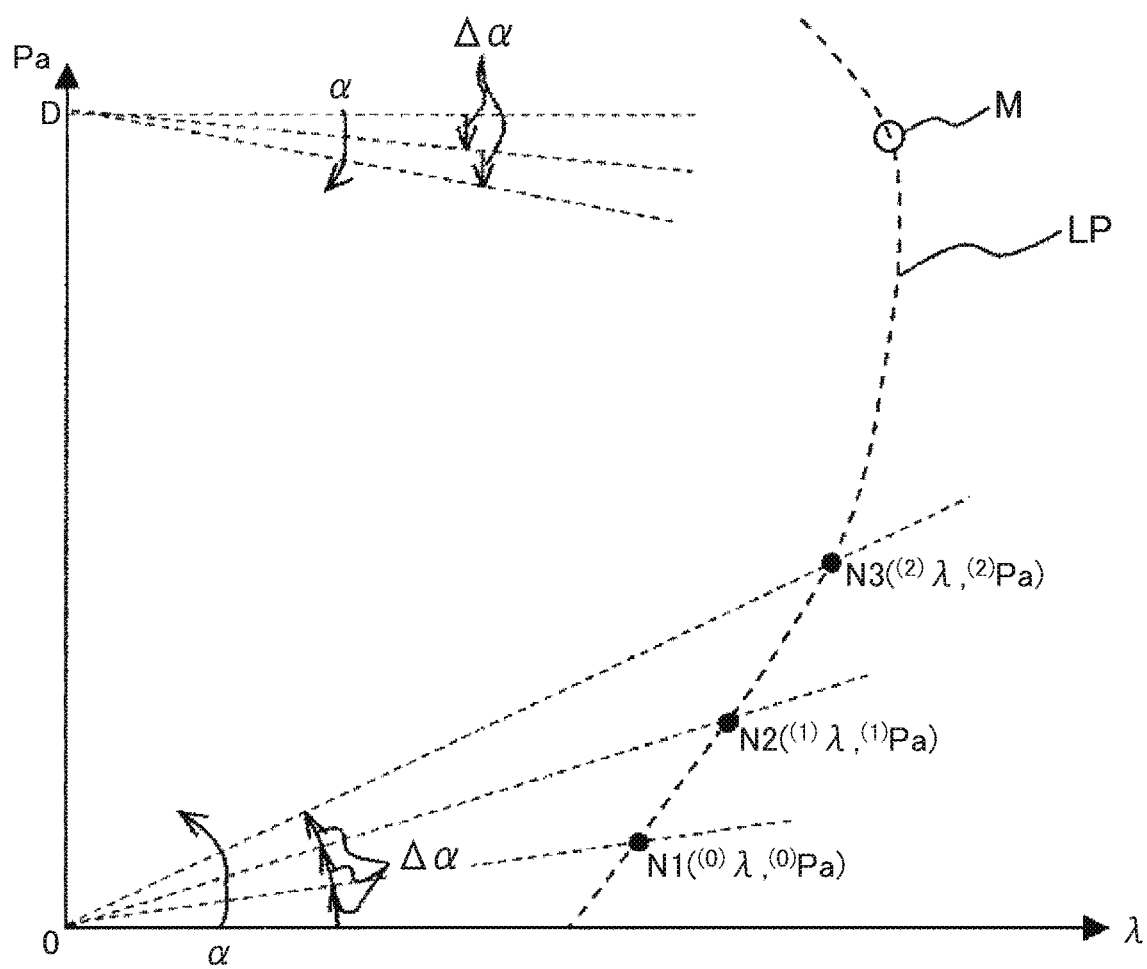
FIG. 18A is a diagram for explaining the processing in a λ-Pa curve.

FIG. 18a is a coordinate plane showing a λ-Pa curve and λ-Pa curve is indicated as LP in FIG. 18a.

In the prediction calculation for the voltage stability limit (point M in FIG. 18a) in the processing step S31 of FIG. 4, an initial power flow calculation is executed, for example, from the original point O as a starting point to determine the initial power flow calculation result point N1 ($^{(0)}$λ, $\Sigma^{(0)}$V$_i$). Then, in the modifier calculation from the processing steps S32 to S34 in FIG. 4, N2 ($^{(0)}$λ, $\Sigma^{(0)}$V$_i$) and N3 ($^{(2)}$λ, $\Sigma^{(2)}$V$_i$) are determined, and further, a maximum load point M is determined provisionally by the calculation of the L-A method in the processing step S41 in FIG. 4. The maximum load point M determined here is a provisional MLP point. In FIG. 18a, while the provisional MLP point is estimated with the original point O as a start point, a point D on the Pa axis may also be used as the start point.

Figure 18B:
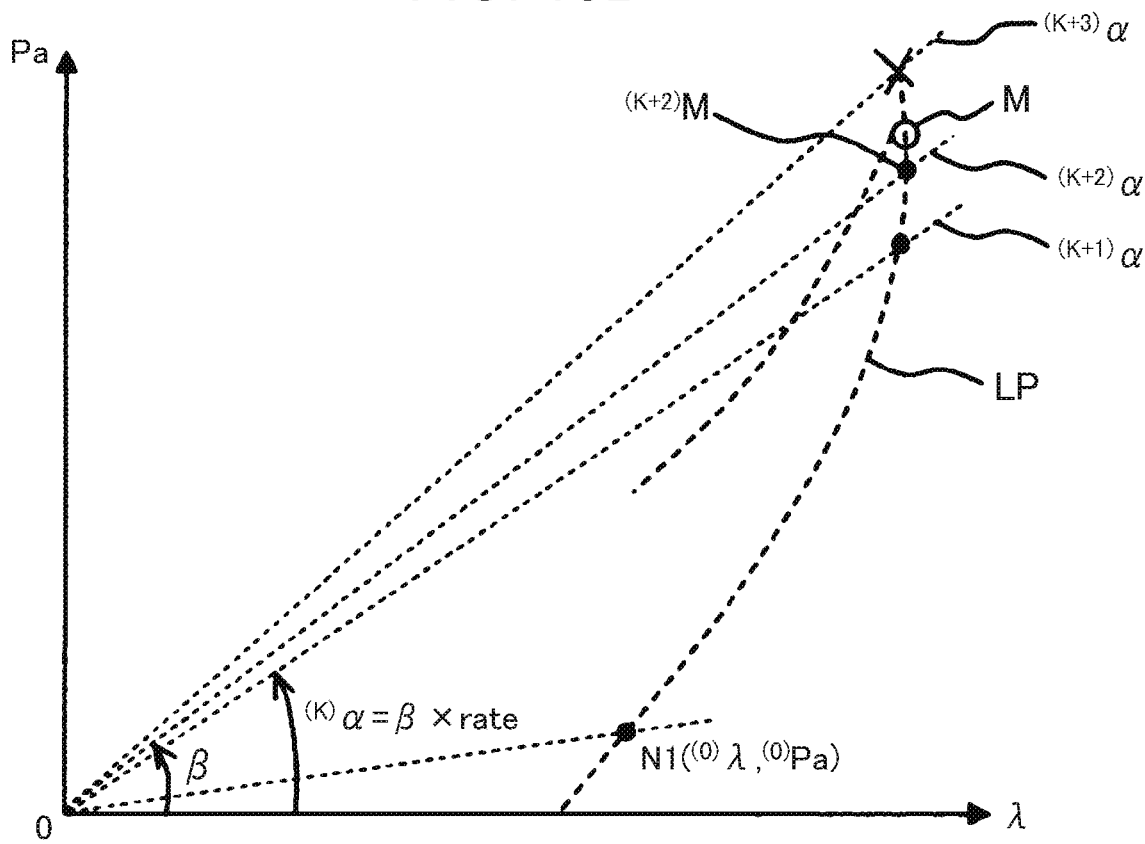
FIG. 18B is a diagram for explaining the processing in a λ-Pa curve.

FIG. 18b represents that the processing is executed successively while determining a gradient $^k$α for detailed search in the vicinity of a provisional MLP point, and when the maximum load point M is exceeded and converges no more, this is determined as completion (determination of the maximum load point). Specifically, calculation is executed while changing the gradient $^{(k)}$α as $^{(k+1)}$α, $^{(k+2)}$α, $^{(k+3)}$α successively, and as a result, in a case where it converges at the gradient $^{(k+1)}$α and $^{(k+2)}$α but not converges for the first time at the gradient $^{(k+3)}$α, the gradient $^{(k+2)}$α is taken and determined as the MLP point.

Figure 20:
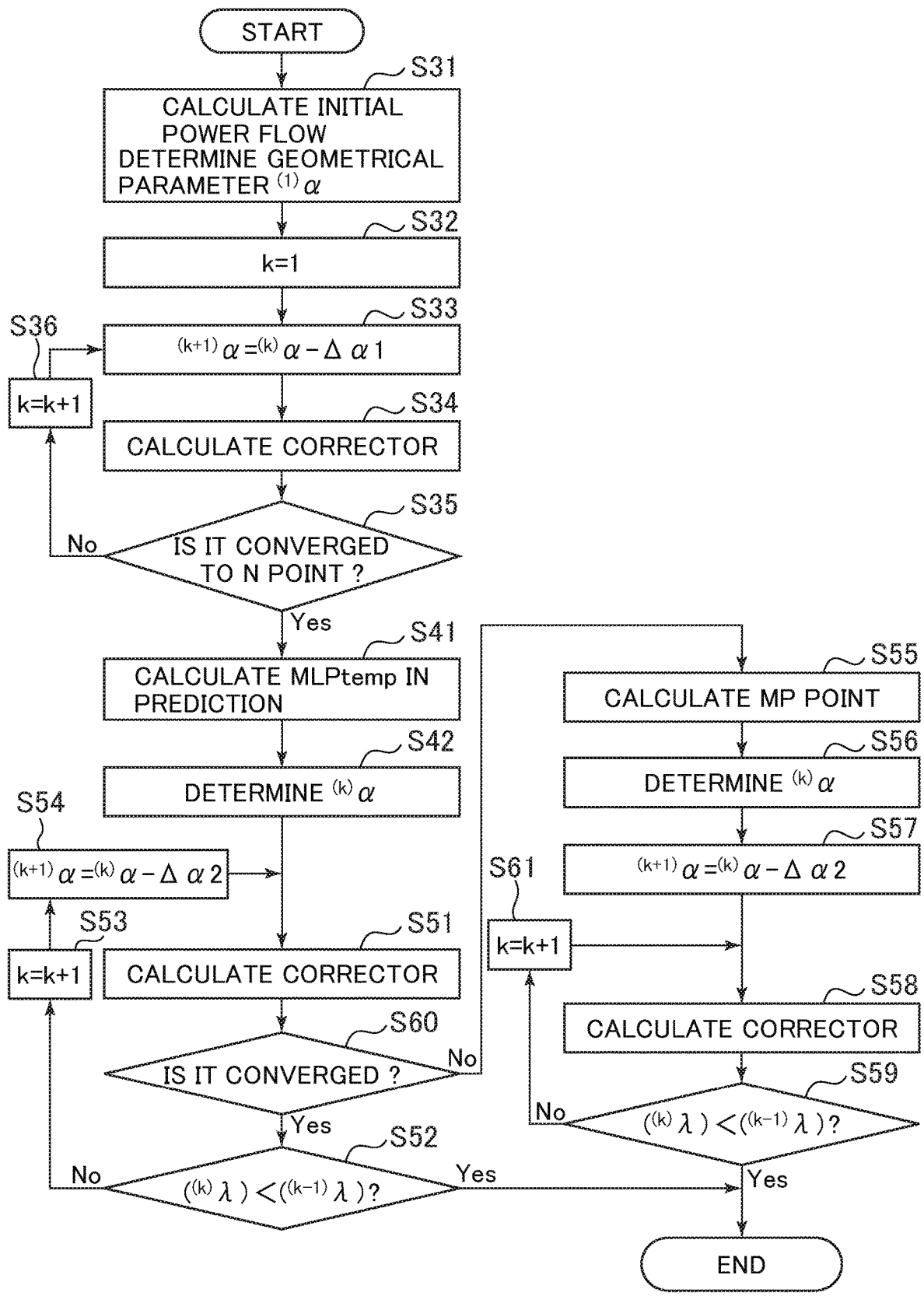
FIG. 20 is a flow chart for explaining another example of a processing of voltage stability limit prediction calculation-voltage stability curve calculation.

FIG. 20 shows a flow chart of a modified representative example, which is effective when the modifier calculation in S34 or S51 is not converged, as in FIG. 4 as a representative although applicable to each of the embodiments. In FIG. 20, convergence judgement in the processing step S60 is added to the flow shown in FIG. 4 and the flow including the processing step S55 to the processing step S59 is added to further improve the calculation accuracy of MLP.

Explanation is to be made mainly for the difference from FIG. 4. First, in the processing step S55, an MP point is calculated. The MP point (middle point) is calculated finally in a region between the convergence point k and the point k−1 converged one step before by using the formula (45).

[Formula 45]

$$G(x,\lambda)=0 \quad (45)$$

By using the thus determined MP point instead of the point O, the gradient $^{(k)}$α is calculated again by using the formula (46) in the processing step S56.

[Formula 46]

$$R(V,\lambda,\alpha)=\alpha(\lambda-^{(n)}\lambda)-(\Sigma V_i-\Sigma^{(n)}V_i)=0 \quad (46)$$

Then, in the processing step S57, the gradient $^{(k+1)}$α is determined and the modifier calculation is executed by using the formulas (47) and (48) in the processing step S58. By repeating the calculation of judgement in the processing step S59 and increase of k in the processing step S61, MLP can be determined.

[Formula 47]

$$^{(k)}\Delta s = \Delta s_{MLPtemp} \times \text{rate} \quad (47)$$

[Formula 48]

$$\Delta s_{MLPtemp}^2 = \sum_{i=1}^{n}\left\{(^{MLPtemp}x_i - {}^{(k)}x_i)^2\right\} + (^{MLPtemp}\lambda_i - {}^{(k)}\lambda_i)^2 \quad (48)$$

The fourth embodiment of the present invention has been described above. The method of the fourth embodiment is applicable based on the identical concept also to a case of intending to determine MLP more strictly further after determination of MLP in each of the first to third embodiments. When it is decided whether the method is applied or not, the difference between MLP and λ or ΣV$_i$ determined 1 point before or after is defined, and if it is larger than a predetermined threshold value, it is judged that the calculation is rough to proceed to MLP point calculation. This can avoid wasteful calculation.

In the present invention described above, the voltage stability margin calculated in the voltage stability margin calculation unit is a deviation from a determined reference point, an initial convergence point, or an operational point to a voltage stability limit point, a maximum load point, a saddle node branch point, or an instant instable point, or a value obtained by dividing by a value relating to a deviation determining reference point, an initial convergence point or an operational point. It means, for example, $\Delta\lambda_{MLP} = (\lambda_{MLP}-^{(0)}\lambda)$, $\Delta\lambda_{MLP}=(\lambda_{MLP}-^{(0)}\lambda)/^{(0)}\lambda$ of the formula (41), $\Delta P_{MLP}=(P_{MLP}-^{(0)}P)$, or $\Delta P_{MLP}=(P_{MLP}-^{(0)}P))/^{(0)}P$ of the Formula (41) and $\Delta\Sigma V_{MLP}$.

Further, the geometrical parameter value in the present invention is a gradient α of a straight line in a case of PCPF, and is an arc length Δs in a case of CPF in the first embodiment. While the gradient α of the straight line in PCPF has been described as the geometrical parameter, coefficients a, b, c of x=a(x−b)^2+c may be used as the geometrical parameter of the curve. Further, when the radius Δs of a circle (: arc length) in CPF is defined as the geometrical parameter, convergence points are obtained in more cases.

Further, in the present invention, when convergence points are determined as intersections between the straight line or the curve and the voltage stability curve by setting geometrical parameters of straight lines or curves passing a reference point determined on a coordinate representing the voltage stability curve while changing them successively and calculating convergence points on the voltage stability curve upon each of geometrical parameters, while they are intersections in the diagram, convergence calculation is necessary for determining them. While the estimation is a part of the calculation, a convergence calculation is executed actually. When an actual point is compared with the convergence point, the convergence point may be said to be an estimation point, but what is used in the specification in the meaning of estimation is only MLPtemp calculation.

LIST OF REFERENCE SIGNS

10: voltage stability monitoring device
11: display unit
12: input unit
13: communication unit
14: CPU
15: memory
DB1: system measurement database
DB2: system facility database
DB3: calculation setting database
DB5 program database
DB1: input database
DB4: calculation result database
31: voltage stability limit prediction unit
32: voltage stability calculation condition determination unit
33: voltage stability curve calculation unit
34: voltage stability margin calculation unit 43: bus line
44: measuring device
D1: system measurement data
100: electrical power system
110: power source
120a, 120b, 121a, 121b: bus
130a, 130b: transformer
140a, 140b, 141a, 141b: line
150: load
300: communication network

The invention claimed is:

1. A voltage stability monitoring device for estimating a voltage stability by using a voltage stability curve representing the voltage stability in an electrical power system, comprising:
   a display screen configured to display information to an operator of the voltage stability monitoring device based on inputs from the electrical power system;
   a memory storing a program for execution by the voltage stability monitoring device; and
   a processor programmed to execute the program, which when executed causes the processor to:
      communicate, via a communication circuit in the voltage stability monitoring device, with a measuring device arranged in the electrical power system to obtain measurement data about the electrical power system including voltages, currents, and power values,
      predict a voltage stability limit in the voltage stability curve based on the measurement data,
      determine voltage stability calculation conditions by using a prediction result of the voltage stability limit,
      calculate the voltage stability curve by using the voltage stability calculation conditions,
      calculate a voltage stability margin by using a calculation result of the voltage stability curve, and
      successively display a plurality of voltage stability information on the display screen of the voltage stability monitoring device, including at least one of the voltage stability margin, the voltage stability curve, and the prediction result, which indicate an operational situation of the voltage stability monitoring device.

2. The voltage stability monitoring device according to claim 1,
   wherein the voltage stability limit prediction unit calculates the voltage stability limit by any one of a repetitive power flow calculation method, a repetitive optimal power flow calculation method, a continuation power flow calculation method, a geometrical parameterization technique for the continuation power flow calculation, an approximate calculation method based on the geometrical parameterization technique for the power flow calculation, the optimal power flow calculation method, the repetitive power flow calculation method, the repetitive optimal power flow calculation method, the continuation power flow calculation method, the continuation power flow calculation, or the direct calculation method.

3. The voltage stability monitoring device according to claim 2,
   wherein the geometrical parameter of the geometrical parameterization technique for the continuation power flow calculation is an angle between each of a plurality of straight lines passing a reference point determined on the coordinate representing the voltage stability curve or coefficients of polynomials of curves passing the reference point determined on the coordinate representing the voltage stability curve and the geometrical parameter in the continuation power flow calculation is a distance of a radius of a circle or a sphere having, as a center, the reference point or each of convergence points.

4. The voltage stability monitoring device according to claim 3,
   wherein the device contains the information of electric power system restriction conditions, and changes the geometrical parameter in accordance with a difference between the voltage stability margin determined in the voltage stability margin calculation unit and the restriction conditions.

5. The voltage stability monitoring device according to claim 1,
   wherein the voltage stability calculation conditions determined by the voltage stability calculation condition determination unit include parameters necessary for the calculation in the repetitive power flow calculation method, a repetitive optimal power flow calculation method, a continuation power flow calculation method or a geometrical parametrization technique for the continuous power flow calculation.

6. The voltage stability monitoring device according to claim 5,
   wherein the parameter necessary for the calculation is a factor of determining an angle between each of straight lines upon setting a plurality of straight lines from a reference point on the coordinate representing the voltage stability curve, a factor of determining coefficients of polynomial of a curve upon setting a plurality of curves from a reference point on the coordinate representing the voltage stability curve, and a factor determining a radius of a circle or a sphere having, as a center, from a reference point or each of convergence point on a coordinate representing the voltage stability curve.

7. The voltage stability monitoring device according to claim 1, comprising a calculation setting database for assuming generation or no generation of one or more of fluctuation of voltage and electrical power flow amount caused by output fluctuation or load fluctuation of rechargeable energy, change or fluctuation of power source configuration, fluctuation of frequency characteristics and voltage characteristics of loads, parallel-in and parallel-out of phase modifying equipment, fluctuation of load power factor, fluctuation of restrictions of generator output, reactive power supply equipment and line power flow, change and fluctuation of the system configuration in view of the system operation, fluctuation of line impedance caused by line temperature, window velocity, power flow amount, etc., fluctuation of system configuration caused by generation of accident or failure, for example, due to lightening thunder to the system.

8. The voltage stability monitoring device according to claim 1,
   wherein when there are one or more of fluctuation condition of the voltage and the power flow amount caused by output fluctuation or load fluctuation of rechargeable energy, changing or fluctuation conditions of power source configurations, fluctuation conditions of frequency characteristics and voltage characteristics of loads, parallel-in and parallel-out condition of phase modifying equipment, fluctuation condition of load power factor, fluctuation conditions of restriction of generator output, reactive power supply equipment or line power flow, changing condition or fluctuation condition of system configuration in view of system operation, fluctuation conditions of line impedance that fluctuates depending on the line temperature, wind velocity, power flow amount, etc., fluctuation conditions of system configuration caused by accident or failure, for example, due to lightening thunder to the system, buses or locations as monitoring targets of voltage stability margin, the voltage stability margin calculation unit calculates one or more of severe fluctuation conditions, the buses and locations as monitoring targets, and voltage stability and voltage stability margin thereof, within a constant or variable monitoring period.

9. The voltage stability monitoring device according to claim 1,
wherein the voltage stability margin calculated in the voltage stability margin calculation unit is a deviation from a determined reference point, an initial convergence point or an operational point to a voltage stability limit point, a maximum load point, a saddle node branch point, or an immediate instability point, or a value obtained by dividing the deviation with a value relative to the determined reference point, the initial convergence point or the operational point.

10. The voltage stability monitoring device according to claim 1,
wherein the voltage stability curve calculation unit calculates the voltage stability curve by any one of a repetitive power flow calculation method, a repetitive optimal power flow calculation method, a continuation power flow calculation method, a geometrical parameterization technique for the continuation power flow calculation, and an approximate calculation method based on the geometrical parameterization technique for the power flow calculation method, the optimal power flow calculation method, the continuation power flow calculation method, the repetitive optimal power flow calculation method, the continuation power flow calculation method, and the continuation power flow calculation.

11. The voltage stability monitoring device according to claim 1,
wherein when the stability curve is calculated, with a calculation result of the voltage stability, by any one of a repetitive power flow calculation method, a repetitive optimal power flow calculation method, a continuation power flow calculation method, a geometrical parameterization technique for continuation power flow calculation, and an approximate calculation method based on the geometrical parameterization technique for the power flow calculation method, if the voltage stability limit is not determined, one or more of change of a notched value of the prediction calculation, reverse change of the sign of the geometrical parameter, change of the start point of the geometrical parameter are performed to continue the voltage stability curve calculation.

12. The voltage stability monitoring device according to claim 1,
wherein the voltage stability margin calculation unit has a database of a threshold value for selecting vulnerability.

13. The voltage stability monitoring device according to claim 1,
wherein the processing of the calculation parameter or calculation algorithm in the voltage stability limit prediction unit, the voltage stability calculation condition determination unit, and the voltage stability curve calculation unit are executed in parallel.

14. A voltage stability monitoring device for estimating a voltage stability by using a voltage stability curve representing the voltage stability in an electric power system, including:
a display screen configured to display information to an operator of the voltage stability monitoring device based on inputs from the electrical power system;
a memory storing a program for execution by the voltage stability monitoring device; and
a processor programmed to execute the program, which when executed causes the processor to:
communicate, via a communication circuit in the voltage stability monitoring device, with a measuring device arranged in the electrical power system to obtain measurement data about the electrical power system including voltages, currents, and power values,
determine an initial convergence point on a coordinate representing the voltage stability curve by initial power flow calculation,
determine a geometrical parameter value of a straight line or a curve passing a reference point determined on a coordinate, or a geometrical parameter value of a circle or a sphere having, as a center, the reference point or each of convergence points,
determine a plurality of convergence points on the voltage stability curve by using the geometrical parameter values,
determine the voltage stability curve in view of the plurality of convergence points,
determine a margin value of the voltage stability based on the value according to the voltage or the electric power at the maximum load point of the voltage stability curve and a value according to the voltage or electric power at the reference point determining the initial convergence point or the determined reference point, and
successively display a plurality of voltage stability information on the display screen of the voltage stability monitoring device, including at least one of the margin value of the voltage stability, the voltage stability curve, the plurality of convergence points, and the reference point, which indicate an operational situation of the voltage stability monitoring device.

15. A voltage stability monitoring method for estimating a voltage stability by using a voltage stability curve representing the voltage stability in an electric power system, comprising:
communicating, via a communication circuit in a voltage stability monitoring device, with a measuring device arranged in the electrical power system to obtain measurement data about the electrical power system including voltages, currents, and power values,
determining an initial convergence point on the coordinate representing the voltage stability curve by initial power flow calculation,
determining a geometrical parameter value of a straight line or a curve passing a reference point determined on the coordinate, or a geometrical parameter value of a circle having, as a center, the reference point or each of convergence points, determining a plurality of convergence points on the voltage stability curve by using the geometrical parameter values, determining the voltage stability curve based on the plurality of convergence points, determining a voltage value of the stability margin based on the value according to the voltage or the electric power at the maximum load point on the voltage stability curve and a value according to the voltage or the electric power at the initial convergence point or the determined reference point, and successively displaying a plurality of voltage stability information on a display screen of the voltage stability monitoring device, including at least one of the stability margin, the voltage stability curve, the plurality of convergence points, and the reference point, which indicate an operational situation of the voltage stability monitoring device.

16. The voltage stability monitoring method according to claim 15, further comprising:

setting a plurality of the geometrical parameter values to the vicinity of the maximum load point for the voltage stability curve and determining the maximum load point again.

17. The voltage stability monitoring method according to claim 15, wherein when the determining of the plurality of power flow points on the voltage stability curve is executed by using a plurality of the geometrical parameters, the power flow points are determined while considering a ratio of the extent of the voltage to the extent of the voltage as a result of the initial power flow calculation, when the load of the electric power system has a characteristic of fluctuating depending on the voltage.

18. The voltage stability monitoring method according to claim 15, wherein when the voltage stability curve is determined by setting the geometrical parameter, if the modifier calculation does not converge, the geometrical parameters is set with the position on the voltage stability curve when the corrector calculation converges voltage stability curve as the second start point upon convergence of the corrector thereby determining the voltage stability curve again.

19. The voltage stability monitoring method according to claim 15, wherein the geometrical parameter is set and the voltage stability curve is determined, the determined position on the voltage stability curve is defined as a second start point, and the voltage stability curve is determined again by setting the geometrical parameter.

20. A voltage stability monitoring method in a voltage stability monitoring device for estimating a voltage stability by using a voltage stability curve representing a voltage stability in an electric power system, comprising:

setting a geometrical parameter of a straight line or curve passing a determined reference point on a coordinate representing the voltage stability curve while changing the parameter successively, the calculating convergence point on the voltage stability curve upon each of geometrical parameters, and defining the convergence point on the voltage stability curve upon geometrical parameter immediately before the convergence point as an intersection between the straight line or the curve and the voltage stability curve can no more be calculated or when the abscissa on the coordinate becomes maximum therebefore as a maximum load point of the voltage stability curve, and successively displaying a plurality of voltage stability information on a display screen of the voltage stability monitoring device, including at least one of the voltage stability curve, the convergence point, the reference point, and the maximum load point, which indicate an operational situation of the voltage stability monitoring device.

21. The voltage stability monitoring method according to claim 20, wherein a value according to a voltage or an electric power at the convergence point of the voltage stability curve upon geometrical parameter immediately before the convergence point as the intersection between the straight line or the curve and the voltage stability curve can no more be calculated and a value according to the voltage or the electric power is defined as a second difference point, geometrical parameters of a plurality of straight lines or curves passing the second reference point are set while changing them successively, and the convergence point with the voltage stability curve upon geometrical parameter is calculated again.

* * * * *